United States Patent
Soga et al.

(10) Patent No.: US 10,416,557 B2
(45) Date of Patent: Sep. 17, 2019

(54) METHOD FOR MANUFACTURING SEMICONDUCTOR APPARATUS, METHOD FOR MANUFACTURING FLIP-CHIP TYPE SEMICONDUCTOR APPARATUS, SEMICONDUCTOR APPARATUS, AND FLIP-CHIP TYPE SEMICONDUCTOR APPARATUS

(71) Applicant: SHIN-ETSU CHEMICAL CO., LTD., Tokyo (JP)

(72) Inventors: Kyoko Soga, Annaka (JP); Satoshi Asai, Maebashi (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/426,746

(22) Filed: Feb. 7, 2017

(65) Prior Publication Data

US 2017/0250162 A1    Aug. 31, 2017

(30) Foreign Application Priority Data

Feb. 26, 2016 (JP) ................ 2016-035304

(51) Int. Cl.
*G03F 7/038* (2006.01)
*C08G 77/18* (2006.01)
(Continued)

(52) U.S. Cl.
CPC .......... *G03F 7/038* (2013.01); *C08G 59/621* (2013.01); *C08G 59/623* (2013.01); *C08G 77/18* (2013.01); *C08L 63/00* (2013.01); *C08L 83/14* (2013.01); *G03F 7/0382* (2013.01); *G03F 7/0757* (2013.01); *H01L 21/563* (2013.01); *H01L 21/78* (2013.01); *H01L 23/296* (2013.01); *H01L 24/13* (2013.01); *H01L 24/27* (2013.01); *H01L 24/29* (2013.01); *H01L 24/73* (2013.01); *H01L 24/81* (2013.01); *H01L 24/83* (2013.01); *H01L 24/92* (2013.01); *H01L 24/94* (2013.01); *H01L 25/0657* (2013.01); *H01L 25/50* (2013.01); *C08G 77/52* (2013.01); *H01L 24/03* (2013.01); *H01L 24/05* (2013.01); *H01L 24/11* (2013.01); *H01L 24/16* (2013.01); *H01L 2224/0345* (2013.01); *H01L 2224/0346* (2013.01); *H01L 2224/0401* (2013.01); *H01L 2224/05147* (2013.01); *H01L 2224/05647* (2013.01); *H01L 2224/05655* (2013.01); *H01L 2224/11002* (2013.01); *H01L 2224/1146* (2013.01); *H01L 2224/1147* (2013.01); *H01L 2224/11334* (2013.01); *H01L 2224/11901* (2013.01); *H01L 2224/133* (2013.01); *H01L 2224/1329* (2013.01); *H01L 2224/13082* (2013.01); *H01L 2224/13083* (2013.01); *H01L 2224/13111* (2013.01); *H01L 2224/13116* (2013.01); *H01L 2224/13147* (2013.01); *H01L 2224/13155* (2013.01); *H01L 2224/13291* (2013.01); *H01L 2224/13393* (2013.01); *H01L 2224/16148* (2013.01); *H01L 2224/271* (2013.01); *H01L 2224/2741* (2013.01); *H01L 2224/27416* (2013.01); *H01L 2224/27422* (2013.01); *H01L 2224/27436* (2013.01); *H01L 2224/27618* (2013.01); *H01L 2224/27848* (2013.01); *H01L 2224/29011* (2013.01); *H01L 2224/2919* (2013.01); *H01L 2224/73104* (2013.01); *H01L 2224/73204* (2013.01); *H01L 2224/8114* (2013.01); *H01L 2224/81191* (2013.01); *H01L 2224/81193* (2013.01);
(Continued)

(58) Field of Classification Search
CPC ....... G03F 7/075; G03F 7/0751; G03F 7/2002
See application file for complete search history.

(56) References Cited

U.S. PATENT DOCUMENTS

2005/0266670 A1   12/2005   Lin et al.
2006/0068521 A1   3/2006   Shi et al.
(Continued)

FOREIGN PATENT DOCUMENTS

EP    1 198 003 A1    4/2002
EP    1 732 116 A2    12/2006
(Continued)

OTHER PUBLICATIONS

Dec. 25, 2018 Notification of Reasons for Refusal issued in Japanese Application No. 2016-35304.
(Continued)

*Primary Examiner* — Kathleen Duda
(74) *Attorney, Agent, or Firm* — Oliff PLC

(57) ABSTRACT

A method for manufacturing a semiconductor apparatus, including preparing a first substrate provided with a pad optionally having a plug and a second substrate or device provided with a plug, forming a solder ball on at least one of the pad or plug of first substrate and the plug of second substrate or device, covering at least one of a pad-forming surface of first substrate and a plug-forming surface of second substrate or device with a photosensitive insulating layer, forming an opening on the pad or plug of the substrate or device that has been covered with photosensitive insulating layer by lithography, pressure-bonding the second substrate or device's plug to the pad or plug of first substrate with the solder ball through the opening, electrically connecting pad or plug of first substrate to second substrate or device's plug by baking, and curing photosensitive insulating layer by baking.

11 Claims, 3 Drawing Sheets

(51) Int. Cl.
  *H01L 21/56* (2006.01)
  *H01L 21/78* (2006.01)
  *H01L 23/29* (2006.01)
  *H01L 23/00* (2006.01)
  *H01L 25/065* (2006.01)
  *H01L 25/00* (2006.01)
  *C08L 63/00* (2006.01)
  *C08L 83/14* (2006.01)
  *G03F 7/075* (2006.01)
  *C08G 59/62* (2006.01)
  *C08G 77/52* (2006.01)

(52) U.S. Cl.
  CPC ............... *H01L 2224/81203* (2013.01); *H01L 2224/81204* (2013.01); *H01L 2224/81815* (2013.01); *H01L 2224/81986* (2013.01); *H01L 2224/83048* (2013.01); *H01L 2224/83075* (2013.01); *H01L 2224/83191* (2013.01); *H01L 2224/83192* (2013.01); *H01L 2224/83193* (2013.01); *H01L 2224/83203* (2013.01); *H01L 2224/83204* (2013.01); *H01L 2224/83862* (2013.01); *H01L 2224/83986* (2013.01); *H01L 2224/9211* (2013.01); *H01L 2224/92125* (2013.01); *H01L 2224/92143* (2013.01); *H01L 2224/94* (2013.01); *H01L 2225/06513* (2013.01); *H01L 2225/06565* (2013.01); *H01L 2225/06568* (2013.01); *H01L 2924/00015* (2013.01); *H01L 2924/3511* (2013.01); *H01L 2924/381* (2013.01); *H01L 2924/3841* (2013.01)

(56) References Cited

U.S. PATENT DOCUMENTS

| | | |
|---|---|---|
| 2013/0029145 A1 | 1/2013 | Kato et al. |
| 2013/0299986 A1 | 11/2013 | Sun et al. |
| 2014/0106137 A1 | 4/2014 | Kondo et al. |
| 2014/0183761 A1* | 7/2014 | Lin .................. H01L 24/11 257/787 |
| 2014/0342530 A1 | 11/2014 | Yasuda et al. |
| 2017/0103932 A1 | 4/2017 | Takemura et al. |

FOREIGN PATENT DOCUMENTS

| | | |
|---|---|---|
| EP | 2 305 754 A1 | 4/2011 |
| EP | 2 364 847 A1 | 9/2011 |
| EP | 2 492 332 A1 | 8/2012 |
| EP | 3 128 548 A1 | 2/2017 |
| JP | H10-270497 A | 10/1998 |
| JP | 2000-357704 A | 12/2000 |
| JP | 2007-053256 A | 3/2007 |
| JP | 2013-048215 A | 3/2013 |
| JP | 2014-096563 A | 5/2014 |
| JP | 2015-026638 A | 2/2015 |
| JP | 2015-195240 A | 11/2015 |
| WO | 03/077029 A1 | 9/2003 |
| WO | 2015/151426 A1 | 10/2015 |

OTHER PUBLICATIONS

Apr. 11, 2017 Partial European Search Report issued in European Patent Application No. 17000283.6.

Aug. 11, 2017 Extended Search Report issued in European Patent Application No. 17000283.6.

* cited by examiner

METHOD FOR MANUFACTURING SEMICONDUCTOR APPARATUS, METHOD FOR MANUFACTURING FLIP-CHIP TYPE SEMICONDUCTOR APPARATUS, SEMICONDUCTOR APPARATUS, AND FLIP-CHIP TYPE SEMICONDUCTOR APPARATUS

TECHNICAL FIELD

The present invention relates to a method for manufacturing a semiconductor apparatus, a method for manufacturing a flip-chip type semiconductor apparatus, a semiconductor apparatus, and a flip-chip type semiconductor apparatus.

BACKGROUND ART

As various electronic devices including a personal computer, a digital camera, and a mobile phone progress toward downsizing and higher performance, requirements are rapidly increasing for further downsizing, thinning, and densifying in semiconductor devices. Accordingly, it is desired to develop an insulating material, a stacked semiconductor apparatus, and a method for manufacturing the same that can cope with an increase in surface area of a substrate for the sake of higher productivity, and can be used in high density mounting technologies including a chip size package or a chip scale package (CSP) and a three-dimensional lamination.

Furthermore, along with the development of electronic devices toward downsizing and higher performance, a process for manufacturing semiconductor devices has also developed to meet requirements for high density and high function in semiconductor devices. For example, the semiconductor devices are shifted to fragile one having a fine wiring rule to cope with a narrow pitch and a high speed processing and using a ultra-low dielectric material to cope with a high frequency.

Conventional examples of a method for manufacturing a semiconductor apparatus by connecting an electrode formed on a semiconductor device to an interconnect pattern formed on a substrate include connection between the semiconductor device and the substrate by wire bonding. However, the connection between the semiconductor device and the substrate by wire bonding requires a space for drawing metal wire on the semiconductor device. This makes the apparatus large, resulting in difficulty downsizing. Thus, this method cannot meet requirements for high density mounting. Therefore, wafer bonding for bonding substrates each having a wiring, chip scale package for mounting semiconductor devices on a substrate, and flip-chip mounting are devised as methods for mounting semiconductor devices to realize three-dimensional mounting. In particular, the flip-chip mounting, which uses bumps on electrodes for short wiring connection, is desirable to make use of circuit characteristics of semiconductor devices having a fine wiring rule to cope with a narrow pitch and a high speed processing and using a ultra-low dielectric material to cope with a high frequency. Moreover, bump formation and mounting are required to be performed under a low load to cope with the fragility of the semiconductor devices.

Under such circumstances, a method for forming bumps, for use in flip-chip mounting, on electrodes of semiconductor devices has been proposed. In this technique, a photosensitive resin layer body is pressure-bonded to an electrode-forming surface of a base such as a semiconductor substrate or a wafer under heating, the photosensitive resin layer body is subjected to exposure and development to form openings on electrodes, and the electrodes exposed to the openings are plated to form bumps (See PATENT LITERATURE 1, for example).

The conventional method for manufacturing the bump-attached semiconductor device will now be described with reference to FIGS. 9(a) and 9(b).

Manufacturing the bump-attached semiconductor device begins with, as shown in FIG. 9(a), applying a photosensitive polyimide resin 2101 on an electrode-forming surface of a semiconductor device or a substrate 2102. After drying the resin, part of the photosensitive polyimide resin 2101 on electrode pads 2110 is removed by mask exposure and development to form openings. The photosensitive polyimide resin 2101 is then thermally cured to be used as a protective film, and bumps 2114 are formed by plating on the electrode pads 2110 exposed to the openings, as shown in FIG. 9(b), whereby the bump-attached semiconductor device 2120 is obtained. The plating may be performed, for example, after forming a passivation film such as a Ti film on aluminum electrode pads 2110 of the semiconductor device or the substrate 2102, plating the film with Cr or Ni and further Au to form plating bumps 2114 with a total thickness of about 5 to 30 μm.

In the above conventional example, when the bumps are formed with a narrow pitch to meet the recent requirement, via holes formed in the on-electrode portion of the protective film have small diameter to achieve the narrow pitch. However, such openings, so-called via holes, have high aspect ratio so that a plating solution for forming the bumps is difficult to enter and renew therein. This reduces plating rate and easily causes variation of thickness of the plating layer.

Furthermore, since the plating bump is a rigid metal bump, this bump cannot achieve a sufficient following deformation under a low load stress for avoiding breakage of the fragile semiconductor device. To deform the bump of the semiconductor device in accordance with warpage and waviness of a circuit board and achieve electrical connection in flip-chip mounting, a high load is necessary in flip-chip mounting. Unfortunately, the high load easily breaks the recent fragile semiconductor devices using a ultra-low dielectric material and damages active elements under their electrodes.

To solve this problem, PATENT LITERATURE 2 proposes a bump-attached semiconductor device including a protective film formed on an electrode-forming surface and a bump electrically connected to an electrode and protruding from the protective film, in which the protective film is provided with a via hole connecting to the electrode, the via hole contains a via post composed of a conductive resin and electrically connected to the electrode, and the via post has the bump protruding from the surface of the protective film. This bump-attached semiconductor device includes the via post composed of a conductive resin excellent in stress absorption within the via hole, thus enabling deformation in accordance with warpage and waviness of a circuit board even under a low load.

Besides, a semiconductor-device-mounting substrate in which a semiconductor device having a bump is connected to a substrate by flip-chip mounting as is has a remarkably low reliability of wet resistance since an electrode portion of the semiconductor is exposed to the air. In addition, there is another problem that a stress applied to the electrode junction makes the connection detached.

To improve reliability of the junction after connecting the bump and the circuit board, the following method is employed: a space between the semiconductor device and the circuit board is filled with a liquid resin, called an underfilling material, followed by curing to fix the semiconductor device and the circuit board.

However, a semiconductor device especially used in flip-chip mounting usually has many electrodes. These electrodes are disposed around the semiconductor device depending on a circuit design of the semiconductor device. At filling with the underfilling material, the liquid resin is poured into a space between the electrodes of the semiconductor device through gravity and a capillary phenomenon. However, when the distance between the semiconductor device and the circuit board is narrow about 10 μm to 500 μm, the liquid resin cannot reach the center of the semiconductor device, which leads to an unfilled portion and destabilizes operation of the semiconductor device. Moreover, filling with the underfilling material through a gravity and a capillary phenomenon takes a long time. Furthermore, electrical connection between the electrode of the semiconductor device and the circuit board easily causes a short circuit of a conductive resin and solder due to a narrow electrode interval.

To solve these problems, PATENT LITERATURE 3 proposes fixing a semiconductor device with a thermoplastic insulating adhesive film having a glass transition temperature lower than a temperature at which a bump of the semiconductor device is connected when the bump electrode of the semiconductor device is directly connected to a circuit board. In PATENT LITERATURE 3, the bump electrode is put into the insulating adhesive film that has been softened by heating so as to pierce the insulating adhesive film, whereby the circuit board and the bump electrode of the semiconductor device are connected. However, this method has a low material selectivity of the insulating adhesive film, and is insufficient in adhesion between the circuit board and the semiconductor device.

CITATION LIST

Patent Literature

PATENT LITERATURE 1: Japanese Patent Laid-Open Publication No. 2000-357704
PATENT LITERATURE 2: Japanese Patent Laid-Open Publication No. 2007-53256
PATENT LITERATURE 3: Japanese Patent Laid-Open Publication No. H10-270497

SUMMARY OF INVENTION

Technical Problem

The present invention was accomplished in view of the above-described problems, and has an object to provide a semiconductor apparatus in which substrates or a substrate and a device are favorably bonded and electrically connected, and a method for manufacturing the same. Another object is to provide a flip-chip type semiconductor apparatus including such semiconductor apparatuses and a method for manufacturing the same.

Solution to Problem

To solve the above-mentioned problems, the present invention provides a method for manufacturing a semiconductor apparatus having a three-dimensional layered structure formed by stacking a plurality of semiconductor circuit layers, the method comprising:

preparing a first substrate and a second substrate or a second device to be stacked on the first substrate, the first substrate being provided with an electrode pad exposed to an outside of the substrate for serving as a conductive connection portion, or being provided with the electrode pad and a conductive plug composed of a conductive material and protruding from the electrode pad, the second substrate and the second device being provided with a conductive plug composed of a conductive material and exposed to an outside of the device or the substrate;

forming a solder ball on at least one of the electrode pad or the conductive plug of the first substrate and the conductive plug of the second substrate or the second device;

covering at least one of a surface on which the electrode pad of the first substrate has been formed and a surface on which the conductive plug of the second substrate or the second device has been formed with a photosensitive insulating layer;

forming an opening on the electrode pad or the conductive plug of the substrate or the device that has been covered with the photosensitive insulating layer, by lithography via a mask;

pressure-bonding the conductive plug of the second substrate or the second device to the electrode pad or the conductive plug of the first substrate with the solder ball through the formed opening;

melting the solder ball by baking to fix and electrically connect the electrode pad or the conductive plug of the first substrate to the conductive plug of the second substrate or the second device; and curing the photosensitive insulating layer by baking.

In this method for manufacturing a semiconductor apparatus, the substrate or the device is previously covered with the photosensitive insulating layer, and then an opening is formed in the photosensitive insulating layer by lithography. This enables manufacture of a semiconductor apparatus in which the substrates or the substrate and the device are favorably bonded and electrically connected.

Preferably, the pressure-bonding and the electrically connecting are simultaneously performed.

This method can reduce the number of steps, thus increasing productivity.

The preparing step preferably includes cutting a substrate having devices into individual pieces or detaching a device from a substrate to which the device has been temporarily bonded to prepare the second device.

Thus, a method of cutting a substrate having devices into individual pieces or a method of detaching a device from a substrate to which the device has been temporarily bonded can be employed to prepare the second device.

The photosensitive insulating layer is preferably an organic layer containing one resin selected from a silicone resin containing an aromatic group and a silicone resin containing an epoxy group.

Such resins have low elasticity. Thus, the photosensitive insulating layer containing such resins can sufficiently absorb roughness on the substrate surface when the substrate is bonded after forming a pattern by lithography, hardly causing voids.

The photosensitive insulating layer is preferably formed of a chemically amplified negative resist composition containing:

(A) a silicone skeleton-containing polymer compound having a repeating unit shown by the following general formula (1) and having a weight average molecular weight of 3,000 to 500,000,

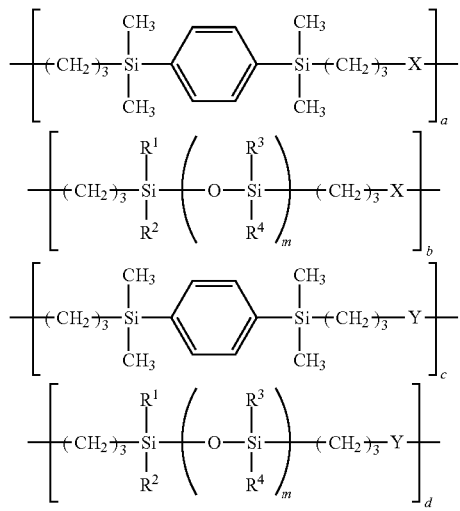

wherein $R^1$ to $R^4$ may be the same or different and represent a monovalent hydrocarbon group having 1 to 8 carbon atoms; "m" is an integer of 1 to 100; "a", "b", "c", and "d" are each 0 or a positive number, and "a", "b", "c", and "d" are not simultaneously 0, provided that a+b+c+d=1; X represents an organic group shown by the following general formula (2); and Y represents an organic group shown by the following general formula (3);

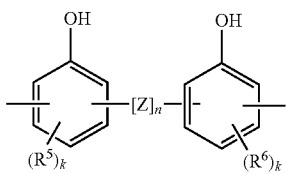

wherein Z represents a divalent organic group selected from any of

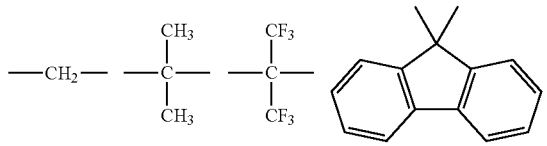

"n" is 0 or 1; $R^5$ and $R^6$ each represent an alkyl group or alkoxy group having 1 to 4 carbon atoms and may be the same or different from each other; and "k" is 0, 1, or 2;

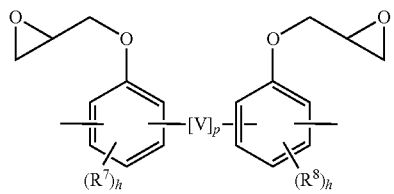

wherein V represents a divalent organic group selected from any of

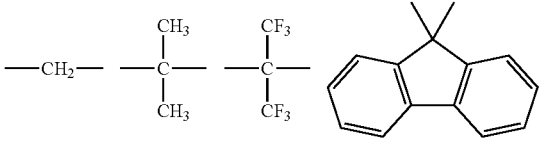

"p" is 0 or 1; $R^7$ and $R^8$ each represent an alkyl group or alkoxy group having 1 to 4 carbon atoms and may be the same or different from each other; and "h" is 0, 1, or 2, (B) one or two or more crosslinking agents selected from an amino condensate modified with formaldehyde or formaldehyde-alcohol and a phenol compound having on average two or more methylol groups or alkoxymethylol groups per molecule, (C) a photo acid generator capable of generating an acid by decomposition with light having a wavelength of 190 to 500 nm, (D) an epoxy-group containing crosslinking agent, and (E) a solvent.

The photosensitive insulating layer formed of the above chemically amplified negative resist composition has low elasticity even after curing. This layer can relax a stress caused by difference in thermal expansion of used materials after the substrates and chips are stacked, and reduce warpage of the semiconductor apparatus, which is expected to occur when the semiconductor apparatus is diced into individual pieces. Thus, such a semiconductor apparatus is suitable for stacking and placing on a circuit board.

The step of covering with the photosensitive insulating layer preferably includes applying a photosensitive material on at least one of the surface on which the electrode pad of the first substrate has been formed and the surface on which the conductive plug of the second substrate or the second device has been formed, and drying the photosensitive material to form the photosensitive insulating layer.

Alternatively, the step of covering with the photosensitive insulating layer preferably includes laminating a photo-curable dry film on at least one of the surface on which the electrode pad of the first substrate has been formed and the surface on which the conductive plug of the second substrate or the second device has been formed to form the photosensitive insulating layer, the photo-curable dry film being obtained by applying a photosensitive material on a supporting film and drying the photosensitive material.

Thus, a method of applying a photosensitive material or a method of laminating a photo-curable dry film can be employed to form the photosensitive insulating layer.

Furthermore, the present invention provides a method for manufacturing a flip-chip type semiconductor apparatus, comprising stacking a plurality of semiconductor apparatuses manufactured by the above inventive method, whereby a flip-chip type semiconductor apparatus is manufactured.

This method for manufacturing a flip-chip type semiconductor apparatus enables easy manufacture of a flip-chip type semiconductor apparatus.

Furthermore, the present invention provides a semiconductor apparatus having a three-dimensional layered structure formed by stacking a plurality of semiconductor circuit layers, the semiconductor apparatus comprising:

a first substrate provided with an electrode pad exposed to an outside of the substrate for serving as a conductive connection portion, or provided with the electrode pad and a conductive plug composed of a conductive material and protruding from the electrode pad;

a photosensitive insulating layer stacked on the first substrate and having an opening on the electrode pad or the conductive plug;

a second substrate or a second device stacked on the photosensitive insulating layer and provided with a conductive plug composed of a conductive material and exposed to an outside of the device or the substrate; wherein the conductive plug of the second substrate or the second device is electrically connected to the electrode pad or the conductive plug of the first substrate with a solder ball through the opening, and the photosensitive insulating layer is formed of a chemically amplified negative resist composition containing:

(A) a silicone skeleton-containing polymer compound having a repeating unit shown by the following general formula (1) and having a weight average molecular weight of 3,000 to 500,000,

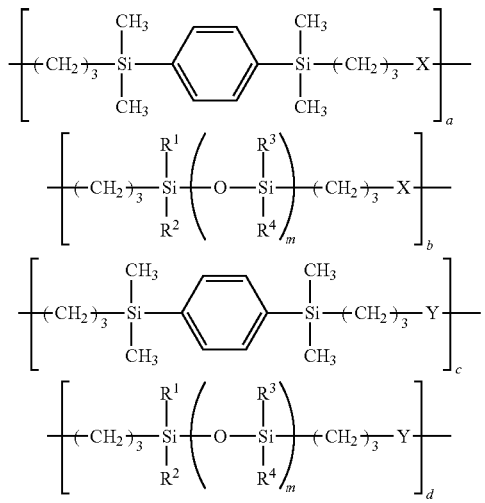

wherein $R^1$ to $R^4$ may be the same or different and represent a monovalent hydrocarbon group having 1 to 8 carbon atoms; "m" is an integer of 1 to 100; "a", "b", "c", and "d" are each 0 or a positive number, and "a", "b", "c", and "d" are not simultaneously 0, provided that a+b+c+d=1; X represents an organic group shown by the following general formula (2); and Y represents an organic group shown by the following general formula (3);

(2)

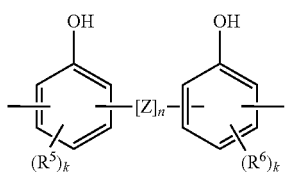

wherein Z represents a divalent organic group selected from any of

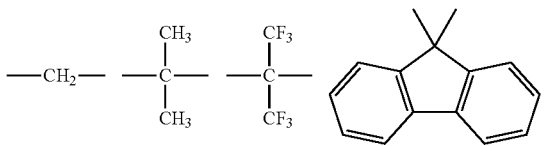

"n" is 0 or 1; $R^5$ and $R^6$ each represent an alkyl group or alkoxy group having 1 to 4 carbon atoms and may be the same or different from each other; and "k" is 0, 1, or 2;

(3)

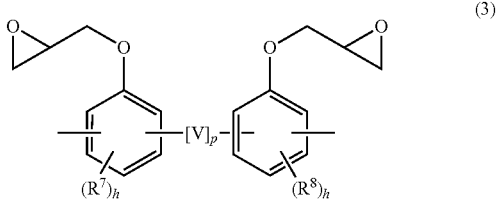

wherein V represents a divalent organic group selected from any of

—CH$_2$—   
$\begin{array}{c}\text{CH}_3\\|\\-\text{C}-\\|\\\text{CH}_3\end{array}$   
$\begin{array}{c}\text{CF}_3\\|\\-\text{C}-\\|\\\text{CF}_3\end{array}$ "p" is 0 or 1; $R^7$ and $R^8$ each represent an alkyl group or alkoxy group having 1 to 4 carbon atoms and may be the same or different from each other; and "h" is 0, 1, or 2, (B) one or two or more crosslinking agents selected from an amino condensate modified with formaldehyde or formaldehyde-alcohol and a phenol compound having on average two or more methylol groups or alkoxymethylol groups per molecule, (C) a photo acid generator capable of generating an acid by decomposition with light having a wavelength of 190 to 500 nm, (D) an epoxy-group containing crosslinking agent, and (E) a solvent.

In this semiconductor apparatus, the substrates or the substrate and the device are favorably bonded and electrically connected. In particular, the inventive semiconductor apparatus uses the photosensitive insulating layer formed of the chemically amplified negative resist composition, which has low elasticity even after curing. This layer can relax a stress caused by difference in thermal expansion of used materials after the substrates and chips are stacked, and reduce warpage of the semiconductor apparatus, which is expected to occur when the semiconductor apparatus is diced into individual pieces. Thus, such a semiconductor apparatus can be suitably stacked and placed on a circuit board.

Furthermore, the present invention provides a flip-chip type semiconductor apparatus, comprising a plurality of the above inventive semiconductor apparatuses that are stacked.

This flip-chip type semiconductor apparatus, in which a plurality of the above inventive semiconductor apparatuses are stacked, has a high reliability.

Advantageous Effects of Invention

The semiconductor apparatuses and the method for manufacturing the same according to the present invention can achieve the following effects.

In the inventive method for manufacturing a semiconductor apparatus, the photosensitive insulating layer can be formed by application such as spin coating or by using a photo-curable dry film. This allows the photosensitive insulating layer to match with the height of the conductive plugs after connection.

Moreover, although the electrode pad or the conductive plug is covered with the insulating layer in the step of forming the photosensitive insulating layer, an unnecessary portion of the photosensitive insulating layer can be easily removed by forming a pattern by lithography using a mask. This allows electrical connection between the electrode pad and the conductive plugs to be easily achieved.

Moreover, insulation between plugs can be achieved by lithography according to size and configuration of the electrode pad or the conductive plug.

In particular, the photosensitive insulating layer formed of the chemically amplified negative resist composition having the silicone skeleton-containing polymer compound in the present invention causes no bonding defect in use of bonding substrates since the chemically amplified negative resist composition contained therein does not produce a by-product gas during photo-crosslinking reaction and thermal crosslinking reaction.

The chemically amplified negative resist composition in the present invention has high transparency at an exposure wavelength range. Thus, even if the photosensitive insulating layer on the substrate is thick, this composition allows a pattern to be formed with high sensitivity without light absorption of the photosensitive insulating layer itself.

Moreover, the chemically amplified negative resist composition in the present invention can form a film that exhibits, when the film is patterned with light and then subjected to heat treatment at a low temperature of 250° C. or lower, excellent adhesiveness to a substrate used for an electronic part, a semiconductor device, or a circuit board, excellent mechanical characteristics, electric insulation property, and reliability as an insulating protective film, and can prevent cracks from occurring in the protective film. Thus, this composition is suitably used for forming a top coat to protect electric and electronic parts such as a circuit board, a semiconductor device, and a display element.

Moreover, the chemically amplified negative resist composition in the present invention can form a film excellent in bonding a substrate. In particular, this film can be used as an insulating film for a semiconductor device including a rewiring use, an insulating film for a multilayer printed substrate, an insulating film for a through electrode of a through-silicon via (TSV), and a cover lay film because of its heat resistance, insulation property, and flexibility, and also can be used for manufacturing a semiconductor apparatus including a step of bonding substrates containing conductive plugs for electrical connection or a step of stacking chips because of its adhesiveness. Therefore, the inventive semiconductor apparatus including the photosensitive insulating layer formed of such a chemically amplified negative resist composition is excellent in reliability.

Moreover, the photosensitive insulating layer using the chemically amplified negative resist composition in the present invention has low elasticity even after curing. This layer can relax a stress caused by difference in thermal expansion of used materials after the substrates and chips are stacked, and reduce warpage of the semiconductor apparatus, which is expected to occur when the semiconductor apparatus is diced into individual pieces. Thus, such a semiconductor apparatus is suitable for stacking and placing on a circuit board.

DESCRIPTION OF EMBODIMENTS

Hereinafter, the present invention will be described in detail.

As previously described, requirements are rapidly increasing for further downsizing, thinning, and densifying in semiconductor apparatuses, and it is desired to develop a semiconductor apparatus in which fine electrodes are formed on a semiconductor device, and the electrodes are directly and electrically connected while insulation between the electrodes is achieved, as well as the semiconductor apparatus can be easily placed on a circuit board and an adhesive material having sufficient adhesiveness, and can be easily stacked; and a method for manufacturing the same.

The present inventors have earnestly investigated to achieve the above object. As a result, they found that when a photosensitive insulating layer is used for connection between substrates in a semiconductor apparatus, and the substrate or the device is covered with the photosensitive insulating layer, more specifically, when the photosensitive insulating layer is formed on the substrate or the device by spin coating or by laminating a dry film having the photosensitive insulating layer using a resist composition, a space between the first substrate and the second substrate or the second device can be filled with the photosensitive insulating layer without voids. Moreover, they found that patterning of the photosensitive insulating layer formed on the substrate or the device by lithography with a mask enables formation of an opening on the conductive plug on the second substrate or the second device and an opening on the electrode pad or the conductive plug on the first substrate even if the distance between the first substrate and the second substrate or the second device ranges from several 10 μm to 500 μm. From these findings, the present invention was brought to completion.

Hereinafter, embodiments of the present invention will be specifically described with reference to drawings, but the present invention is not limited thereto.

Figure 1:
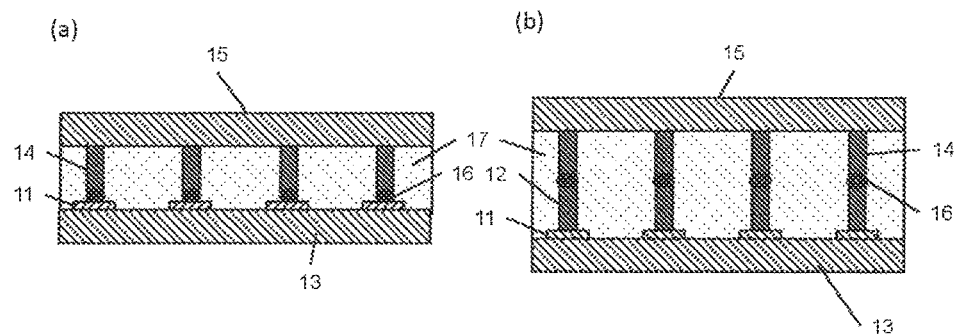
FIG. 1 is a schematic sectional view showing a semiconductor apparatus according to an embodiment of the present invention.

First, the inventive semiconductor apparatus will be described. As shown in FIG. 1(a), the inventive semiconductor apparatus has a three-dimensional layered structure formed by stacking a plurality of semiconductor circuit layers. This semiconductor apparatus includes a first substrate (a first semiconductor substrate) 13 provided with electrode pads 11 exposed to the outside of the substrate for serving as a conductive connection portion, a photosensitive insulating layer 17 stacked on the first substrate 13 and having openings on the electrode pads 11, and a second substrate (a second semiconductor substrate) or a second device (a second semiconductor device) 15 stacked on the photosensitive insulating layer 17 and provided with conductive plugs 14 composed of a conductive material and exposed to the outside of the device or the substrate. The conductive plugs 14 of the second substrate or the second device are electrically connected to the electrode pads 11 of the first substrate with solder balls (solder bumps) 16 through the openings.

Such a semiconductor apparatus includes the photosensitive insulating layer formed between the first substrate and the second substrate or the second device. This layer allows good adhesion and good electrical connection between the substrates or between the substrate and the device. Moreover, the conductive plugs of the second substrate or the second device allows the second substrate or the second device to easily deform in accordance with warpage and waviness of the first substrate.

As shown in FIG. 1(b), the first substrate 13 may have, besides the electrode pads 11, conductive plugs 12 composed of a conductive material and protruding from the electrode pads 11. In this case, the conductive plugs 14 of the second substrate or the second device are electrically connected to the conductive plugs 12 of the first substrate with the solder balls 16. In this case, following deformation of the second substrate or the second device can be further improved.

Figure 6:
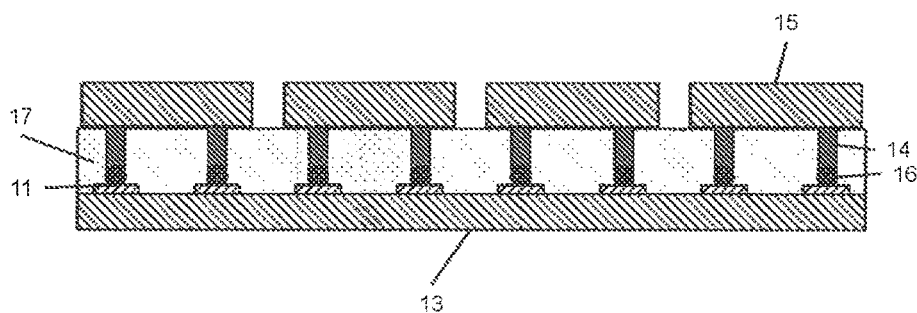
FIG. 6 is a schematic sectional view showing a semiconductor apparatus having a plurality of second devices according to an embodiment of the present invention.

The inventive semiconductor apparatus may include a plurality of the second devices, as shown in FIG. 6. The semiconductor apparatus shown in FIG. 6 includes a first substrate 13, a photosensitive insulating layer 17 stacked on the first substrate 13 and having openings on electrode pads 11 of the first substrate, and multiple second devices 15 stacked on the photosensitive insulating layer 17 and provided with conductive plugs 14. The conductive plugs 14 of the second device are electrically connected to the electrode pads 11 of the first substrate with solder balls 16 through the openings.

In the inventive semiconductor apparatus, the photosensitive insulating layer is formed of a chemically amplified negative resist composition containing:
(A) a silicone skeleton-containing polymer compound having a repeating unit shown by the following general formula (1) and having a weight average molecular weight of 3,000 to 500,000,

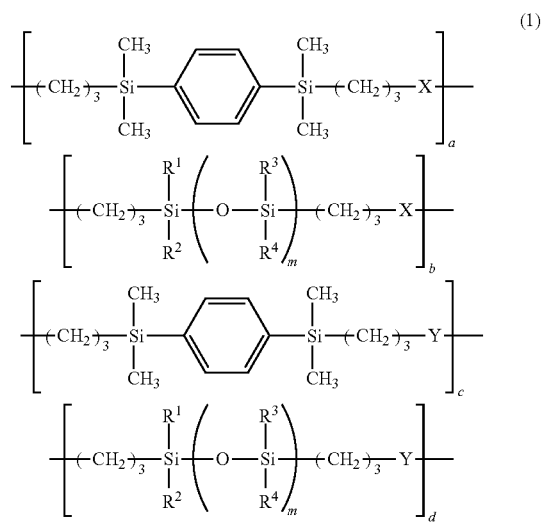

wherein $R^1$ to $R^4$ may be the same or different and represent a monovalent hydrocarbon group having 1 to 8 carbon atoms; "m" is an integer of 1 to 100; "a", "b", "c", and "d" are each 0 or a positive number, and "a", "b", "c", and "d" are not simultaneously 0, provided that a+b+c+d=1; X represents an organic group shown by the following general formula (2); and Y represents an organic group shown by the following general formula (3);

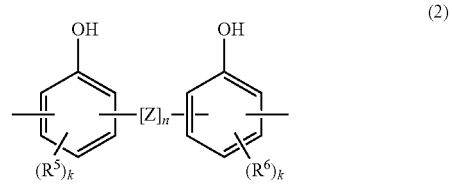

wherein Z represents a divalent organic group selected from any of

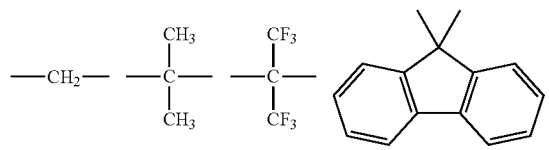

"n" is 0 or 1; $R^5$ and $R^6$ each represent an alkyl group or alkoxy group having 1 to 4 carbon atoms and may be the same or different from each other; and "k" is 0, 1, or 2;

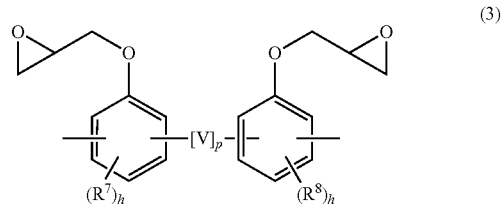

wherein V represents a divalent organic group selected from any of

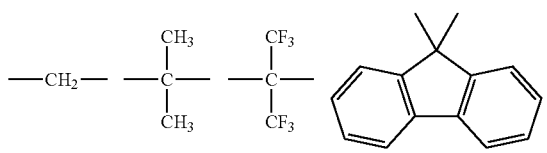

"p" is 0 or 1; R⁷ and R⁸ each represent an alkyl group or alkoxy group having 1 to 4 carbon atoms and may be the same or different from each other; and "h" is 0, 1, or 2, (B) one or two or more crosslinking agents selected from an amino condensate modified with formaldehyde or formaldehyde-alcohol and a phenol compound having on average two or more methylol groups or alkoxymethylol groups per molecule, (C) a photo acid generator capable of generating an acid by decomposition with light having a wavelength of 190 to 500 nm, (D) an epoxy-group containing crosslinking agent, and (E) a solvent.

In this manner, the inventive semiconductor apparatus uses the photosensitive insulating layer formed of the chemically amplified negative resist composition, which has low elasticity even after curing. This layer can relax a stress caused by difference in thermal expansion of used materials after the substrates and chips are stacked, and reduce warpage of the semiconductor apparatus, which is expected to occur when the semiconductor apparatus is diced into individual pieces. Thus, such a semiconductor apparatus can be suitably stacked and placed on a circuit board.

Furthermore, the present invention provides a flip-chip type semiconductor apparatus, including a plurality of the above inventive semiconductor apparatuses that are stacked.

This flip-chip type semiconductor apparatus, in which a plurality of the above inventive semiconductor apparatuses are stacked, has a high reliability.

Figure 7:
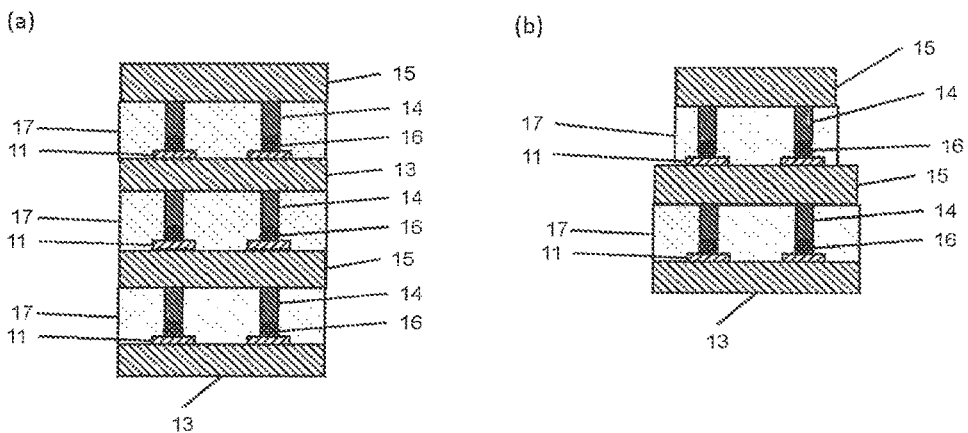
FIG. 7 is a schematic sectional view showing a flip-chip type semiconductor apparatus according to an embodiment of the present invention.

FIG. 7(a) shows a flip-chip type semiconductor apparatus in which two semiconductor apparatuses according to the present invention are stacked. In the embodiment of FIG. 7(a), two semiconductor apparatuses are stacked via the electrode pads 11, solder balls 16, the conductive plugs 14, and the photosensitive insulating layers 17. As shown in FIG. 7(b), the flip-chip type semiconductor apparatus may have a structure in which the second substrate or the second device 15 having the conductive plugs 14 is stacked on the inventive semiconductor apparatus via the electrode pads 11, the solder balls 16, and the photosensitive insulating layer 17.

Each component of the chemically amplified negative resist composition used in the inventive semiconductor apparatus will be described below.

The component (A) is a silicone skeleton-containing polymer compound having a repeating unit shown by the general formula (1) and having a weight average molecular weight of 3,000 to 500,000.

The component (B), crosslinking agents, may be any known crosslinking agents that are one or two or more compounds selected from an amino condensate modified with formaldehyde or formaldehyde-alcohol and a phenol compound having on average two or more methylol groups or alkoxymethylol groups per molecule.

Examples of the amino condensate modified with formaldehyde or formaldehyde-alcohol include melamine condensates modified with formaldehyde or formaldehyde-alcohol and urea condensates modified with formaldehyde or formaldehyde-alcohol. These modified melamine condensates and modified urea condensates may be used alone or in combination of two or more kinds.

Examples of the phenol compound having on average two or more methylol groups or alkoxymethylol groups per molecule include (2-hydroxy-5-methyl)-1,3-benzenedimethanol, 2,2',6,6'-tetramethoxymethyl bisphenol A. These phenol compounds may be used alone or in combination of two or more kinds.

The component (C), a photo acid generator, may be any compound capable of generating an acid by exposure to light having a wavelength of 190 to 500 nm, which serves as a curing catalyst. Examples of such a photo acid generator include onium salts, diazomethane derivatives, glyoxime derivatives, β-ketosulfone derivatives, disulfone derivatives, nitrobenzylsulfonate derivatives, sulfonate ester derivatives, imide-yl-sulfonate derivatives, oximesulfonate derivatives, iminosulfonate derivatives, and triazine derivatives.

The component (D), an epoxy group-containing crosslinking agent, may contain an epoxy compound having on average two or more epoxy groups per molecule although not particularly limited thereto. Examples of this crosslinking agent include bisphenol epoxy resins such as a bisphenol A epoxy resin and a bisphenol F epoxy resin, novolac epoxy resins such as a phenol novolac epoxy resin and a cresol novolac epoxy resin, triphenol alkane epoxy resins and polymers thereof, biphenyl epoxy resins, dicyclopentadiene-modified phenol novolac epoxy resins, phenol aralkyl epoxy resins, biphenyl aralkyl epoxy resins, naphthalene ring-containing epoxy resins, glycidyl ester epoxy resins, alicyclic epoxy resins, and heterocyclic epoxy resins. Among the above crosslinking agents, bisphenol epoxy resins and novolac epoxy resins are preferably used. These crosslinking agents may be used alone or in combination of two or more kinds.

The component (E), a solvent, may be any solvent capable of dissolving (A) the silicone skeleton-containing polymer compound, (B) the crosslinking agents, (C) the photo acid generator, and (D) the epoxy-group containing crosslinking agent. Examples of the solvent include ketones such as cyclohexanone, cyclopentanone, and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone.

The chemically amplified negative resist composition in the present invention can be prepared according to a usual method. The chemically amplified negative resist composition to form the photosensitive insulating layer in the present invention can be prepared by stirring and mixing the above components and optionally filtering a solid component through a filter or the like.

Next, the inventive method for manufacturing a semiconductor apparatus will be described. The inventive method for manufacturing a semiconductor apparatus having a three-dimensional layered structure formed by stacking a plurality of semiconductor circuit layers includes:

preparing a first substrate and a second substrate or a second device to be stacked on the first substrate, the first substrate being provided with an electrode pad exposed to an outside of the substrate for serving as a conductive connection portion, or being provided with the electrode pad and a conductive plug composed of a conductive material and protruding from the electrode pad, the second substrate and the second device being provided with a conductive plug composed of a conductive material and exposed to an outside of the device or the substrate;

forming a solder ball on at least one of the electrode pad or the conductive plug of the first substrate and the conductive plug of the second substrate or the second device;

covering at least one of a surface on which the electrode pad of the first substrate has been formed and a surface on which the conductive plug of the second substrate or the second device has been formed with a photosensitive insulating layer;

forming an opening on the electrode pad or the conductive plug of the substrate or the device that has been covered with the photosensitive insulating layer, by lithography via a mask;

pressure-bonding the conductive plug of the second substrate or the second device to the electrode pad or the conductive plug of the first substrate with the solder ball through the formed opening;

melting the solder ball by baking to fix and electrically connect the electrode pad or the conductive plug of the first substrate to the conductive plug of the second substrate or the second device; and curing the photosensitive insulating layer by baking.

In this method for manufacturing a semiconductor apparatus, the substrate or the device is previously covered with the photosensitive insulating layer, and then an opening is formed in the photosensitive insulating layer by lithography. This enables manufacture of a semiconductor apparatus in which the substrates or the substrate and the device are favorably bonded and electrically connected.

Each step will be described in detail below.

First, a first substrate and a second substrate or a second device to be stacked on the first substrate are prepared, in which the first substrate is provided with an electrode pad exposed to an outside of the substrate for serving as a conductive connection portion, or provided with the electrode pad and a conductive plug composed of a conductive material and protruding from the electrode pad, and the second substrate and the second device are provided with a conductive plug composed of a conductive material and exposed to an outside of the device or the substrate. The conductive plug of the second substrate or the second device may be designed to align with the electrode pad or the conductive plug of the first substrate when the second substrate or the second device is placed at a predetermined position above the first substrate.

Figure 2:
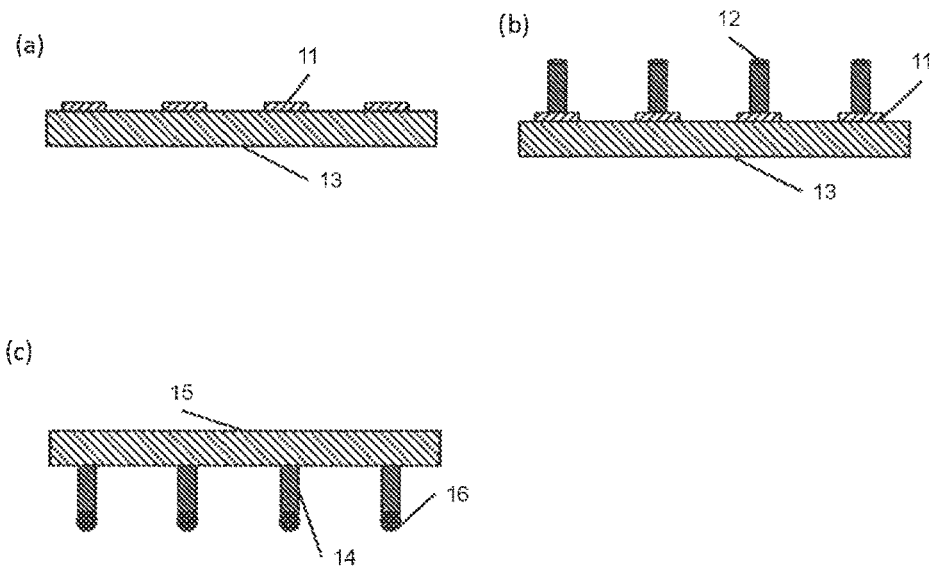
FIG. 2 is a schematic sectional view showing a first substrate and a second substrate or a second device for describing the preparing step and the step of forming a solder ball in the inventive method for manufacturing a semiconductor apparatus.

In the following, the preparing step and the later-described step of forming a solder ball in the inventive method for manufacturing a semiconductor apparatus will be explained with reference to FIG. 2. For example, as shown in FIG. 2(a), a first substrate provided with electrode pads 11 may be prepared as the first substrate 13. Alternatively, as shown in FIG. 2(b), a first substrate provided with electrode pads 11 and conductive plugs 12 may be prepared as the first substrate 13. Moreover, as shown in FIG. 2(c), a second substrate or a second device provided with conductive plugs 14 may be prepared as the second substrate or the second device 15. FIG. 2(c) illustrates that solder balls 16 are formed on the tips of the conductive plugs 14 by the step of forming a solder ball.

In this step, the second device is preferably prepared by cutting a substrate having devices into individual pieces or detaching a device from a substrate to which the device has been temporarily bonded. In the present invention, not only the second substrate but also such a second device can be connected to the first substrate.

Examples of materials of the first substrate, the second substrate, and the second device include silicon doped with a dopant such as boron.

Methods for producing the first substrate, the second substrate, and the second device will now be described. The following example is for the method of preparing the second device by cutting a substrate having devices into individual pieces. In this case, a conductive substrate or a substrate on which a conductive film is formed by sputtering can be used as the substrate having devices. First, a plug-forming surface of the substrate is covered with a photosensitive resin layer. The thickness of the photosensitive resin layer is preferably thicker than the height of plugs to be formed. The used photosensitive resin layer is preferably, but not particularly limited to, a resin layer of a composition containing a known positive resist material (an alkali-soluble resin). The photosensitive resin layer is then exposed to light via a photomask having a pattern to exposure a plug-forming portion, and the exposed portion is removed by development by spraying an alkali aqueous solution. The photosensitive resin film having the recessed plug-forming portion can be thus obtained. Then, residues at the bottom of the recess are removed by $O_2$ ashing, and a plug having a prescribed height is formed by plating. For the plug formation, copper plating is typically used, but any conductive material can be used without particular limitation.

Examples of the conductive material include resins, such as silicone resins and epoxy resins, to which a conductive filler, such as carbon particles and metal particles, has been added. The conductive plug made of such a conductive material other than plating can more greatly improve the following deformation.

The electrode pad of the first substrate may also be formed by copper plating or the like.

After forming the plug, a substrate having the conductive plug can be obtained by removing the photosensitive resin layer. This substrate can be used as the second substrate.

Moreover, the second device having the conductive plug can be obtained by dicing the substrate obtained according to the above method into individual pieces.

Then, a solder ball is formed on at least one of the electrode pad or the conductive plug of the first substrate and the conductive plug of the second substrate or the second device. A method for forming the solder ball on a tip of the conductive plug or the like is not limited. Typically, the solder ball is formed by continuously plating or mounting a solder ball at the time of forming the conductive plug by plating or filling with a conductive material.

At least one of the electrode pad or the conductive plug of the first substrate and the conductive plug of the second substrate or the second device is provided with solder (the solder ball) having a melting point of, for example, 200° C. or higher to achieve electrical connection between two substrates. The solder for the electrical connection may be, for example, composed of an alloy of lead (Pb) and tin (Sn), an alloy of lead and silver (Ag), or an alloy of antimony (Sb) added to lead and tin. A method for forming the solder on a tip of the conductive plug formed on the second substrate or the second device or the electrode pad or the conductive plug of the first substrate is not particular limited, but the solder may be formed by continuously plating after forming the plug or the electrode pad by plating in the preparing step. A nickel (Ni) layer may be interposed between the plug or the electrode pad and the solder.

When the solder ball is formed on the second device, the preparing step and the step of forming a solder ball may be simultaneously performed. More specifically, the second device having the solder ball may be formed by forming the solder ball on a substrate having devices and cutting the substrate into individual pieces, or forming the solder ball on a device that has been temporarily bonded to a substrate and detaching the device.

Then, at least one of a surface on which the electrode pad of the first substrate has been formed and a surface on which the conductive plug of the second substrate or the second device has been formed (a photosensitive insulating layer-forming surface) is covered with a photosensitive insulating layer. A method for forming the photosensitive insulating layer is not particularly limited. As examples thereof, there may be mentioned a method in which a photosensitive material is applied on the photosensitive insulating layer-forming surface and dried to form the photosensitive insulating layer; and a method in which a photo-curable dry film obtained by applying a photosensitive material on a supporting film and drying the photosensitive material is laminated to the photosensitive insulating layer-forming surface to form the photosensitive insulating layer.

Figure 3:
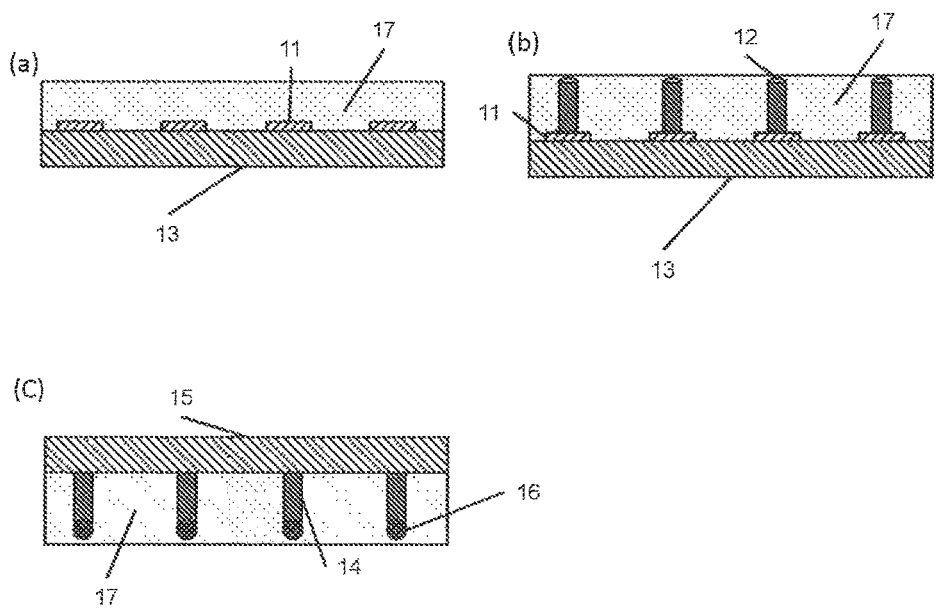
FIG. 3 is a schematic sectional view showing a first substrate and a second substrate or a second device for describing the step of covering with a photosensitive insulating layer in the inventive method for manufacturing a semiconductor apparatus.

In the following, the step of covering with a photosensitive insulating layer in the inventive method for manufacturing a semiconductor apparatus will be described with reference to FIG. 3. For example, as shown in FIG. 3(a), the surface on which the electrode pads 11 of the first substrate have been formed of FIG. 2(a) may be covered with the photosensitive insulating layer 17. Alternatively, as shown in FIG. 3(b), the surface on which the electrode pads 11 and the conductive plugs of the first substrate have been formed of FIG. 2(b) may be covered with the photosensitive insulating layer 17. Moreover, as shown in FIG. 3(c), the surface on which the conductive plugs 14 of the second substrate or the second device have been formed may be covered with the photosensitive insulating layer 17.

In the inventive method for manufacturing a semiconductor apparatus, the material of the photosensitive insulating layer is preferably, but not particularly limited to, a material having low elasticity. The material preferably has a elasticity of 2 GPa or less, particularly preferably 1 GPa or less. Illustrative examples thereof include a material containing one resin selected from a silicone resin containing an aromatic group and a silicone resin containing an epoxy group. Above all, preferred photosensitive material is a photo-curable resin composition containing a silicone skeleton-containing polymer compound having a weight average molecular weight of 3,000 to 500,000. Particularly preferred is the above-mentioned chemically amplified negative resist composition. This composition allows the photosensitive insulating layer to have low elasticity, reducing warpage of a semiconductor apparatus to be manufactured.

In the inventive method for manufacturing a semiconductor apparatus, a photosensitive polyimide resin, which generally has an elasticity of more than 2 GPa, may be used as the material of the photosensitive insulating layer. However, use of a material having lower elasticity than the photosensitive polyimide resin, as mentioned above, enables roughness on the substrate surface to be sufficiently absorbed when the substrate is bonded after forming a pattern by lithography, hardly causing voids. When voids are reduced, substrate adhesion is improved, and reliability is improved.

When the substrate is bonded with the low-elastic material, a stress caused by difference in thermal expansion of the substrate and materials used for packaging can be absorbed, and the stress can be prevented from concentrating on the bump or an interface between the bump and the photosensitive insulating layer. Thus, separation at the interface between the bump and the photosensitive insulating layer and cracking of the photosensitive insulating layer can be prevented, resulting in packaging with good reliability.

The chemically amplified negative resist composition may be applied according to a known lithography technique. For example, the application may be performed by a method such as dipping, spin coating, or roll coating. The application amount may be appropriately selected according to the purpose. The application amount is preferably such an amount that the photosensitive insulating layer is formed with a thickness of 10 to 500 µm, more preferably 10 to 50 µm. To improve film thickness uniformity on the substrate, a solvent may be dropped to the substrate before applying the photosensitive material (pre-wetting method). The kind and the amount of the solvent to be dropped may be appropriately selected according to the purpose. Preferable examples of the solvent to be used include organic solvents, e.g. alcohols such as isopropyl alcohol (IPA), ketones such as cyclohexanone, and glycols such as propylene glycol monomethyl ether. In addition, the solvent used for the photosensitive material (for example, the above-mentioned component (E)) can be used.

To effectively undergo photo-curable reaction, the solvent and so on may be previously evaporated by prebaking (PB) as needed. The prebaking may be performed for example at 40 to 140° C. for 1 minute to 1 hour approximately.

Next, the method of forming the photosensitive insulating layer by laminating a photo-curable dry film will be described.

The photo-curable dry film used in the present invention can be obtained by applying the above photosensitive material on a supporting film and drying the photosensitive material. The photo-curable dry film in the present invention generally includes a photo-curable resin layer, obtained by applying the above photosensitive material on a supporting film and drying the photosensitive material, sandwiched between the supporting film and a protective film.

The supporting film of the photo-curable dry film (photosensitive insulating dry film) used in the inventive method for manufacturing a semiconductor apparatus may be a monolayer or a multilayer film obtained by stacking multiple polymer films. The material thereof may be a synthetic resin film such as polyethylene, polypropylene, polycarbonate, and polyethylene terephthalate. Among them, polyethylene terephthalate, which has appropriate flexibility, mechanical strength, and heat resistance, is preferable. These films may be subjected to various treatments such as corona treatment and coating treatment with a releasing agent. The film may be a commercially available product, and illustrative examples thereof include Cerapeel WZ (RX), Cerapeel BX8 (R) (both are available from Toray Advanced Film Co., Ltd.), E7302, E7304 (both are available from Toyobo Co., Ltd.), Purex G31, Purex G71T1 (both are available from Teijin DuPont Films Japan Ltd.), PET38X1-A3, PET38X1-V8, and PET38X1-X08 (all available from Nippa Co., Ltd.).

The protective film of the photo-curable dry film used in the inventive method for manufacturing a semiconductor apparatus may be the same film as the supporting film mentioned above, but polyethylene terephthalate and polyethylene, which have appropriate flexibility, are preferable. The film may be a commercially available product, and illustrative examples thereof include, besides the polyethylene terephthalates already exemplified, polyethylene such as GF-8 (available from Tamapoly Co., Ltd.) and PE Film 0-Type (available from Nippa Co., Ltd.).

The thicknesses of the supporting film and the protective film are preferably 10 to 300 µm each, in view of stable production of the photo-curable dry film and prevention of rolling habit around a roll axis, so-called curl.

A method for producing the photo-curable dry film used in the inventive method for manufacturing a semiconductor apparatus will be now described. As to an apparatus for producing the photo-curable dry film, a film coater for producing an adhesive product may be generally used. Illustrative examples of the film coater include a comma coater, a comma reverse coater, a multi coater, a die coater, a lip coater, a lip reverse coater, a direct gravure coater, an offset gravure coater, a 3-roll bottom reverse coater, and a 4-roll bottom reverse coater.

The dry film can be produced as follows. A supporting film is rolled-out from a roll-out axis of a film coater, and the photosensitive material is applied onto the supporting film with a prescribed thickness to form a photosensitive insulating layer while the film passes through a coater head of the film coater. This film then passes through a hot-air circulating oven at a prescribed temperature for a prescribed period. The supporting film with the photosensitive insulating layer thus dried thereon passes through a laminate roll together with a protective film rolled-out from another roll-out axis of the film coater under a prescribed pressure to laminate the protective film to the photosensitive insulating layer on the supporting film and then is rolled-up by a roll-up axis of the film coater. In this operation, the temperature of the hot-air circulating oven preferably ranges from 25 to 150° C., the period for passing through preferably ranges from 1 to 100 minutes, and the laminate roll pressure preferably ranges from 0.01 to 5 MPa.

The thickness of the photosensitive insulating layer of the photo-curable dry film used in the inventive method for manufacturing a semiconductor apparatus is typically 10 to 500 µm, preferably 10 to 300 µm, more preferably 10 to 150 µm.

The photo-curable dry film can be produced by the above-mentioned method. Use of the photo-curable dry film can reduce warpage.

When the photosensitive insulating layer is formed by the photo-curable dry film, the photosensitive insulating layer of the photo-curable dry film is laminated so as to cover at least one of the surface on which the electrode pad of the first substrate has been formed and the surface on which the conductive plug of the second substrate or the second device has been formed.

First, the protective film is removed from the above-mentioned photo-curable dry film, and the photosensitive insulating layer is formed by laminating the photosensitive insulating layer of the photo-curable dry film to the semiconductor substrate or the semiconductor device.

An apparatus for laminating the photo-curable dry film to the semiconductor substrate or the semiconductor device is preferably a vacuum laminator. The photo-curable dry film is attached to the film-bonding apparatus, the protective film is removed from the photo-curable dry film, and the photosensitive insulating layer thereby exposed is bonded to the substrate on a table at a prescribed temperature by an adhering roll under a prescribed pressure in a vacuum chamber with a prescribed degree of vacuum. The temperature of the table is preferably 60 to 120° C. The pressure of the adhering roll is preferably 0 to 5.0 MPa. The degree of vacuum of the vacuum chamber is preferably 50 to 500 Pa. Such vacuum lamination prevents voids from occurring on the periphery of the electrode pad and the conductive plug of the semiconductor substrate or device, and thus is preferable.

To effectively undergo photo-curable reaction of the photosensitive insulating layer, or to improve adhesion between the photosensitive insulating layer and substrate or the semiconductor device, or to improve flatness of the adhering photosensitive insulating layer, prebaking (PB) may be performed as needed. The prebaking may be performed for example at 40 to 140° C. for 1 minute to 1 hour approximately.

The application thickness of the photosensitive insulating layer or the thickness of the dry film may be adjusted depending on a gap after electrical connection between the first substrate and the second substrate or the second device, whereby the gap between the substrates or the substrate and the semiconductor device can be fully filled in the pressure-bonding step, described later.

Then, an opening is formed on the electrode pad or the conductive plug of the substrate or the device that has been covered with the photosensitive insulating layer, by lithography via a mask. More specifically, when the surface on which the electrode pad of the first substrate has been formed is covered with the photosensitive insulating layer, an opening is formed on the electrode pad or the conductive plug of the first substrate by lithography via a mask. When the surface on which the electrode pad of the second substrate or the second device has been formed is covered with the photosensitive insulating layer, an opening is formed on the conductive plug of the second substrate or the second device by lithography via a mask. When both the surface on which the electrode pad of the first substrate has been formed and the surface on which the electrode pad of the second substrate or the second device has been formed are covered with the photosensitive insulating layer, an opening is formed on the electrode pad or the conductive plug of the first substrate by lithography via a mask, and an opening is formed on the conductive plug of the second substrate or the second device by lithography via a mask.

Figure 4:
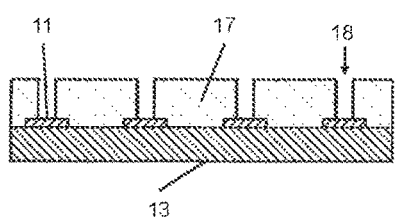
FIG. 4 is a schematic sectional view showing a first substrate and a second substrate or a second device for describing the step of forming an opening in the inventive method for manufacturing a semiconductor apparatus.
Figure 4:
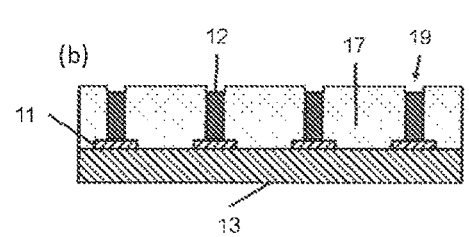
Figure 4:
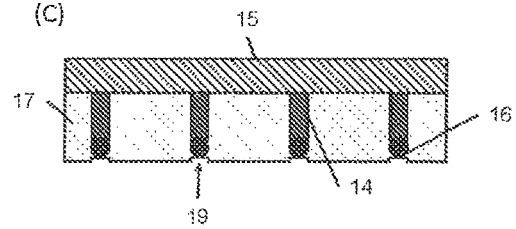

In the following, the step of forming an opening in the inventive method for manufacturing a semiconductor apparatus will be described with reference to FIG. 4. For example, as shown in FIG. 4(a), openings 18 may be formed by lithography via a mask on the electrode pads 11 of the first substrate covered with the photosensitive insulating layer 17 of FIG. 3(a). Alternatively, as shown in FIG. 4(b), openings 19 may be formed by lithography via a mask on the conductive plugs 12 of the first substrate covered with the photosensitive insulating layer 17 of FIG. 3(b). Moreover, as shown in FIG. 4(c), openings 19 may be formed by lithography via a mask on the conductive plugs 14 of the second substrate or the second device covered with the photosensitive insulating layer 17 of FIG. 3(c).

In the step of forming an opening, the photosensitive insulating layer formed in the step of covering with a photosensitive insulating layer is patterned by lithography with a mask to form an opening on the electrode pad and an opening on the conductive plug. The openings may have a diameter of 5 to 300 µm, although it depends on the diameter of the electrode pad to be inserted.

In this patterning, the formed photosensitive insulating layer is exposed to light, subjected to post exposure baking (PEB), and developed. In other words, a known lithography technique can be used for patterning.

The photosensitive insulating layer formed in the step of covering with a photosensitive insulating layer is exposed to light having a wavelength of 190 to 500 nm via a photomask, and then cured. The photomask may be obtained by engraving a prescribed pattern. The photomask is preferably made of a material that can block the light having a wavelength of 190 to 500 nm. For example, a material such as chromium is preferably used, although not limited thereto. Examples of the light having a wavelength of 190 to 500 nm include light having various wavelengths generated from, for example, a radiation-generating apparatus, including ultraviolet rays such as g-line and i-line and far ultraviolet rays (248 nm and 193 nm). The wavelength preferably ranges from 248 to 436 nm. The exposure dose preferably ranges from 10 to 3,000 mJ/cm$^2$. Such exposure causes an exposed part to crosslink, thereby forming a pattern that is insoluble in a developer, described later.

Further, PEB may be performed to enhance the development sensitivity. The PEB is preferably performed at 40 to 140° C. for 0.5 to 10 minutes.

The layer is then developed with a developer. Preferable examples of the developer include organic solvents such as isopropyl alcohol (IPA) and propylene glycol monomethyl ether acetate (PGMEA). Preferable examples of an alkali aqueous solution used for the developer include a 2.38% tetramethyl ammonium hydroxide (TMAH) aqueous solution. In the inventive method for manufacturing a semiconductor apparatus, an organic solvent is preferably used as the developer. The development can be carried out by a usual method, for example, by soaking the substrate having a formed pattern into a developer. Then, if necessary, washing, rinsing, drying, and so forth may be performed to obtain a film of the photosensitive insulating layer having an intended pattern.

Then, the conductive plug of the second substrate or the second device is pressure-bonded to the electrode pad or the conductive plug of the first substrate with the solder ball through the opening formed in the step of forming an opening. The second substrate or the second device is joined to the first substrate at a predetermined position under pressure, whereby the first substrate and the second substrate or the second device are bonded via the photosensitive insulating layer having the formed pattern. The photosensitive insulating layer having the opening may be formed on at least one of the first substrate and the second substrate or the second device by the steps of covering with a photosensitive insulating layer and forming an opening. Thus, in the pressure-bonding step, fixation between the first substrate and the second substrate or the second device and insulation between the electrodes can be performed by, for example, placing the second substrate or the second device above the first substrate, and pressure-bonding them under heating.

Figure 5:
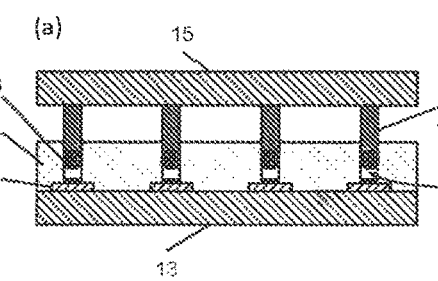
FIG. 5 is a schematic sectional view showing a first substrate and a second substrate or a second device for describing the pressure-bonding step, the electrically connecting step, and the step of curing the photosensitive insulating layer by baking in the inventive method for manufacturing a semiconductor apparatus.
Figure 5:
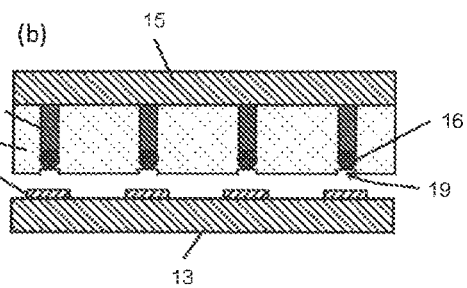
Figure 5:
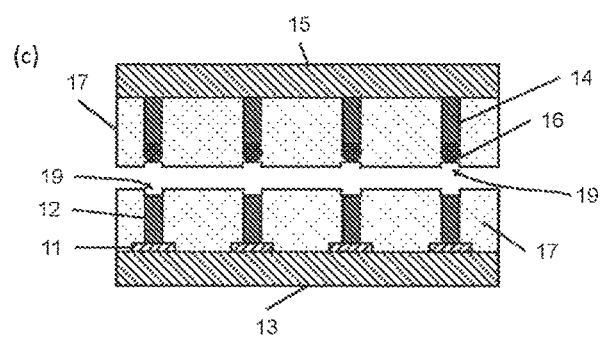

In the following, the pressure-bonding step, electrically connecting step, and step of curing the photosensitive insulating layer by baking, which are described later, will be described with reference to FIG. 5. For example, as shown in FIG. 5(a), the conductive plugs 14 of the second substrate or the second device of FIG. 2(c) may be pressure-bonded to the electrode pads 11 of the first substrate of FIG. 4(a) with the solder balls 16 through the openings 18 formed in FIG. 4(a). Then, electrical connection and curing of the photosensitive insulating layer may be performed. Alternatively, as shown in FIG. 5(b), the conductive plugs 14 of the second substrate or the second device of FIG. 4(c) may be pressure-bonded to the electrode pads 11 of the first substrate of FIG. 2(a) with the solder balls 16 through the openings 19 formed in FIG. 4(c). Then, electrical connection and curing of the photosensitive insulating layer may be performed. Moreover, as shown in FIG. 5(c), the conductive plugs 14 of the second substrate or the second device of FIG. 4(c) may be pressure-bonded to the conductive plugs 12 of the first substrate of FIG. 4(b) with the solder balls 16 through the openings 19 formed in FIG. 4(b) and the openings 19 formed in FIG. 4(c). Then, electrical connection and curing of the photosensitive insulating layer may be performed. In case of FIG. 5(c), the materials of the photosensitive insulating layer 17 on the first substrate side and the photosensitive insulating layer 17 on the second substrate or the second device side may be the same or different.

The photosensitive insulating layer in the present invention serves as a substrate adhesive that makes adhesion between two substrates or a substrate and a semiconductor device, for example, to bond the first substrate coated with the photosensitive material and the second substrate or the second device in the present invention, under preferable heat and pressure conditions. As described previously, the photosensitive insulating layer may be formed on the second substrate or the second device.

The bonding is preferably performed at 50 to 200° C. for 1 to 60 minutes. As a bonding apparatus, a wafer bonder may be used to bond two wafers under reduced pressure while applying a load, or a flip-chip bonder may be used to bond a chip and a wafer. The adhesive layer formed between the substrates increases its bonding strength through a later-described post curing treatment, provides permanent bonding, and plays the same role as underfilling.

Then, the solder ball is melted by baking to fix and electrically connect the electrode pad or the conductive plug of the first substrate to the conductive plug of the second substrate or the second device. In this step, the first substrate and the second substrate or the second device bonded with the photosensitive insulating layer are heated at a bump connection temperature (a temperature at which the solder ball is melted) for bump connection.

The bump connection temperature may be appropriately selected according to the kind of the solder ball. For example, the temperature may be 250 to 270° C. The time of bump connection may also be appropriately selected according to the kind of the solder ball. For example, the time may be 5 seconds to 1 minute.

A pressure may be applied during bump connection. When the first substrate and the second substrate or the second device are electrically connected by pressure-bonding, bonding between the first substrate and the second substrate or the second device with the photosensitive insulating layer and electrical connecting between the electrode pad or the conductive plug of the first substrate and the conductive plug of the second substrate or the second device may be simultaneously performed by one-time pressure-bonding. In other words, the pressure-bonding step and the electrically connecting step may be simultaneously performed. In this manner, the number of steps can be reduced, and productivity can be increased. Otherwise, the pressure-bonding step and the electrically connecting step may be separately performed in two stages.

As previously described, when the first substrate and the second substrate or the second device are bonded with the photosensitive insulating layer, bump connection and fixation of the semiconductor device may be simultaneously performed by one-time pressure-bonding, or pressure-bonding may be separately performed in two stages. More specifically, the first pressure-bonding may be performed at a temperature lower than the bump connection temperature, and the second pressure-bonding may be performed at the bump connection temperature.

When bump connection is performed under pressure, as a bonding apparatus, a wafer bonder may be used to bond two wafers under reduced pressure while applying a load, or a flip-chip bonder may be used to bond a chip and a wafer.

When the first substrate and the second substrate or the second device are pressure-bonded with the flip-chip bonder, the electrically connecting step may be continuously performed after pressure-bonding the first substrate and the second substrate or the second device with the photosensitive insulating layer.

The pressure-bonded step, the electrically connecting step, and the step of curing the photosensitive insulating layer by baking may be performed in any order. For example, among these steps, the step of curing the photosensitive insulating layer by baking may be firstly performed. Alternatively, these steps may be simultaneously performed by one-time heat treatment.

Then, the photosensitive insulating layer bonding the first substrate and the second substrate or the second device is cured by baking. The substrate subjected to the pressure-bonding step and the electrically connecting step is post-cured with an oven or a hot plate at 100 to 250° C., preferably 150 to 220° C. When the post-curing temperature ranges from 100 to 250° C., the crosslinking density of the photosensitive insulating layer increases, and remaining volatile components can be removed. Thus, this temperature range is preferable in view of adhesiveness to substrate, heat resistance, strength, electric insulation property, and bonding strength. The post-curing treatment can increase cross-linking density of a resin top coat and bonding strength of the bonded (stacked) substrate. In addition, since the chemically amplified negative resist composition in the present invention does not produce a by-product gas during photo-crosslinking reaction, a substrate adhesive using this composition does not cause bonding defects (voids). The post-curing time may be 10 minutes to 10 hours, particularly 10 minutes to 3 hours.

The photosensitive insulating layer thus cured provides permanent bonding and allows fixation between the substrates or the substrate and the chip (the device) without underfilling as well as allows insulation between the conductive plugs.

The elasticity of the cured photosensitive insulating layer is preferably 0.05 to 2 GPa, particularly preferably 0.05 to 1 GPa. Use of such a photosensitive insulating layer having an elasticity of 2 GPa or less facilitates adhesion between the semiconductor device and the circuit board with high adhesiveness even if the semiconductor device has dense electrodes, and enables connection with high reliability and insulting property as electric and electronic parts.

The substrate on which the photosensitive insulating layer has been formed may be cut into individual pieces (chips) by dicing to produce the second device having the photosensitive insulating layer.

Figure 8:
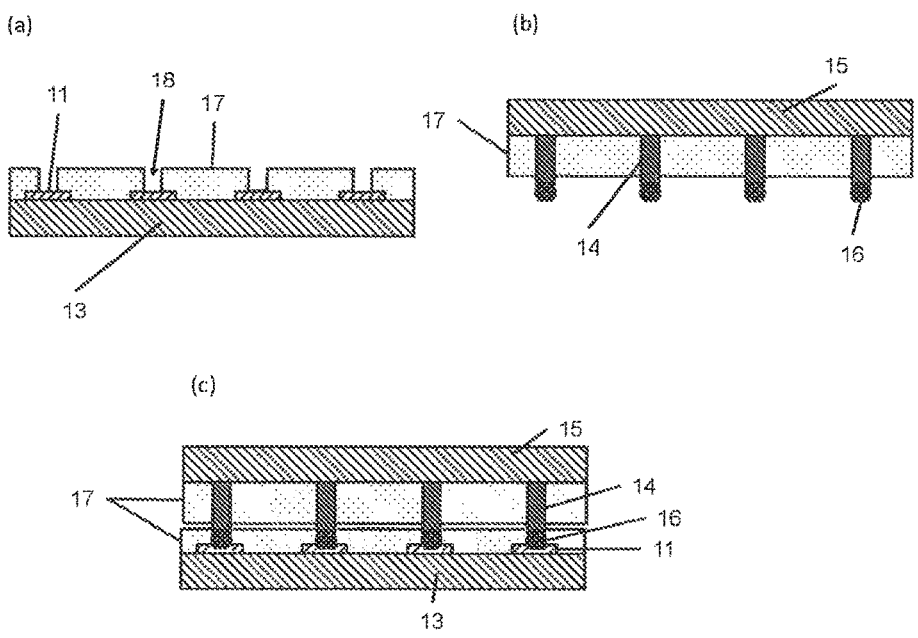
FIG. 8 is a schematic sectional view showing a first substrate and a second substrate or a second device for describing the inventive method for manufacturing a semiconductor apparatus in case of using a second substrate or a second device provided with a conductive plug protruding from the photosensitive insulating layer.
Figure 9:
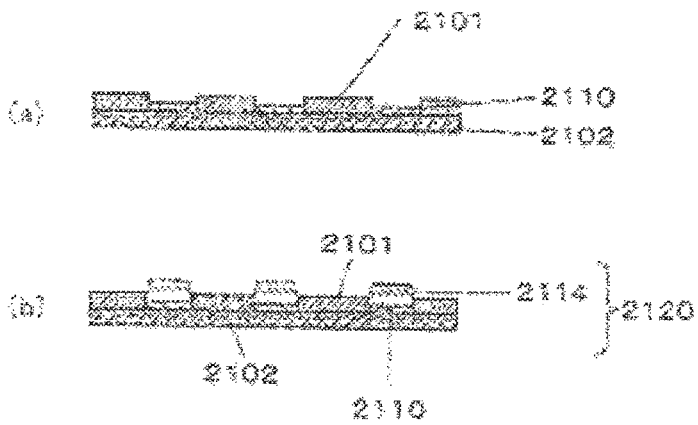
FIG. 9 is a schematic sectional view showing an example of a conventional method for manufacturing a bump-attached semiconductor device.

In the inventive method for manufacturing a semiconductor apparatus, as shown in FIG. 8, the second substrate or the second device may have a conductive plug protruding from the photosensitive insulating layer. As shown in FIG. 8(b), a second substrate or a second device 15 having conductive plugs 14 protruding from the photosensitive insulating layer 17 may be used as the second substrate or the second device. FIG. 8(b) illustrates a substrate in which solder balls 16 are formed on tips of the conductive plugs 14. The second substrate or the second device 15 of FIG. 8(b) and the first substrate 13 of FIG. 8(a) (the producing method is the same as in FIG. 4(a)) can be pressure-bonded as shown in FIG. 8(c).

The semiconductor apparatus characterized by the above connection structure and the photosensitive insulating layer remaining as an insulating layer between the first substrate and the second substrate or the second device and semiconductor devices obtained by cutting this apparatus into individual pieces can be suitably used for fan-out wiring formed in a semiconductor chip and wafer level chip size package (WCSP).

As described above, the inventive method for manufacturing a semiconductor apparatus facilitates placing on a circuit board and stacking the semiconductor apparatus even when fine electrodes are formed on the semiconductor device, and facilitates electrical connection processing of the electrode pad and the conductive plug. In addition, use of the above-mentioned photosensitive insulating layer allows manufacture of a semiconductor apparatus in which warpage is reduced, not only the periphery of the semiconductor device but also the periphery of the conductive plug is embedded without voids, not using underfilling, regardless of the height of the semiconductor device and the density of the conductive plug, and sufficient insulation is achieved.

Moreover, the inventive semiconductor apparatus thus obtained can be easily placed on a circuit board and stacked, and thus can be used for a stacked semiconductor apparatus (a flip-chip type semiconductor apparatus) including the semiconductor apparatuses that are stacked and for an encapsulated stacked-semiconductor apparatus including the stacked semiconductor apparatus that is placed on a circuit board and then encapsulated.

For example, the flip-chip type semiconductor apparatus can be manufactured by stacking a plurality of semiconductor apparatuses obtained by the inventive method for manufacturing a semiconductor apparatus. For example, the flip-chip type semiconductor apparatus shown in FIG. 7(a) can be manufactured by stacking two semiconductor apparatuses in the same manner as the first substrate and the second substrate or the second device are stacked according to the inventive method for manufacturing a semiconductor apparatus.

EXAMPLES

Hereinafter, the present invention will be specifically described with reference to synthesis examples and examples, but the present invention is not limited to the following examples.

The structural formulae of compounds (M-1) to (M-5) used in synthesis examples of the present invention are shown below.

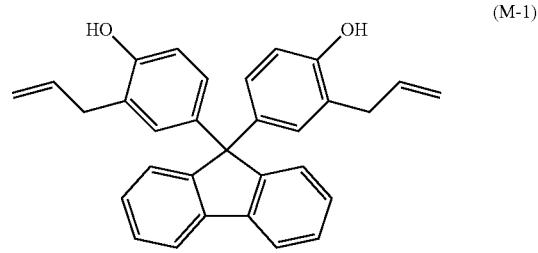

(M-1)

-continued

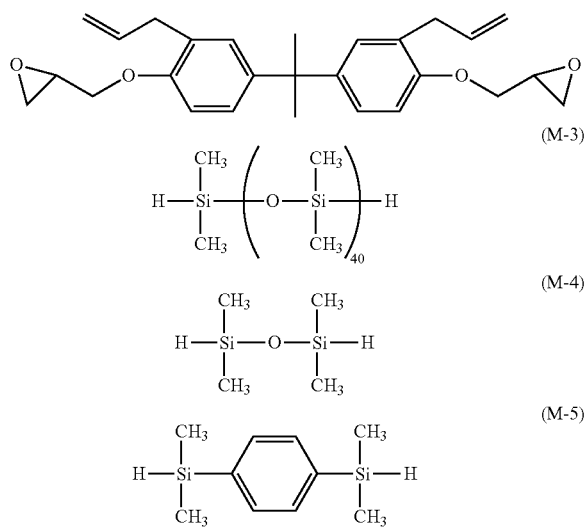

Synthesis Example 1

In a 5-L flask equipped with a stirrer, a thermometer, a nitrogen purge system, and a reflux condenser, 396.9 g of compound (M-1) and 45.0 g of compound (M-2) were dissolved in 1875 g of toluene. Then, 949.6 g of compound (M-3) and 6.1 g of compound (M-4) were added to the solution, and the mixture was heated at 60° C. Thereafter, 2.2 g of carbon carried platinum catalyst (5 mass %) was added thereto, and after confirming that the internal reaction temperature was increased to 65 to 67° C., the mixture was further heated to 90° C. for 3 hours. Then, the mixture was cooled to 60° C., and 2.2 g of carbon carried platinum catalyst (5 mass %) was added again, and 107.3 g of compound (M-5) was added dropwise to the flask over 1 hour. At this time, the temperature inside the flask increased to 78° C. After completion of dropwise addition, the solution was further aged at 90° C. for 3 hours and then cooled to room temperature. Then, 1700 g of methyl isobutyl ketone was added thereto, and the reaction solution was filtered through a filter under pressure to remove the platinum catalyst. Further, 760 g of pure water was added to the obtained polymer compound solution, and the solution was stirred, allowed to stand, and separated into layers to remove the lower aqueous layer. This liquid separation and water-washing operation was repeated 6 times to remove trace amounts of acid components in the polymer compound solution. The solvent in the polymer compound solution was then distilled off under reduced pressure, and 950 g of cyclopentanone was added to obtain a polymer compound solution (A-1) containing the cyclopentanone as the main solvent with a solid concentration of 60 mass %. The molecular weight of the polymer compound in this solution was measured by GPC. As a result, the weight average molecular weight was 62000 in terms of polystyrene. In the formula (1), (c+d)/(a+b+c+d) was 0.10.

Synthesis Example 2

In a 5-L flask equipped with a stirrer, a thermometer, a nitrogen purge system, and a reflux condenser, 441.0 g of compound (M-1) was dissolved in 1875 g of toluene. Then, 949.6 g of compound (M-3) and 6.1 g of compound (M-4) were added to the solution, and the mixture was heated at 60° C. Thereafter, 2.2 g of carbon carried platinum catalyst (5 mass %) was added thereto, and after confirming that the internal reaction temperature was increased to 65 to 67° C., the mixture was further heated to 90° C. for 3 hours. Then, the mixture was cooled to 60° C., and 2.2 g of carbon carried platinum catalyst (5 mass %) was added again, and 107.3 g of compound (M-5) was added dropwise to the flask over 1 hour. At this time, the temperature inside the flask increased to 78° C. After completion of dropwise addition, the solution was further aged at 90° C. for 5 hours and then cooled to room temperature. Then, 1700 g of methyl isobutyl ketone was added thereto, and the reaction solution was filtered through a filter under pressure to remove the platinum catalyst. Further, 760 g of pure water was added to the obtained polymer compound solution, and the solution was stirred, allowed to stand, and separated into layers to remove the lower aqueous layer. This liquid separation and water-washing operation was repeated 6 times to remove trace amounts of acid components in the polymer compound solution. The solvent in the polymer compound solution was then distilled off under reduced pressure, and 950 g of cyclopentanone was added to obtain a polymer compound solution (A-2) containing the cyclopentanone as the main solvent with a solid concentration of 60 mass %. The molecular weight of the polymer compound in this solution was measured by GPC. As a result, the weight average molecular weight was 51000 in terms of polystyrene. In the formula (1), (c+d)/(a+b+c+d) was 0.

(C) photo acid generators used in formulation examples in the present invention, shown in Table 1, are as follows.

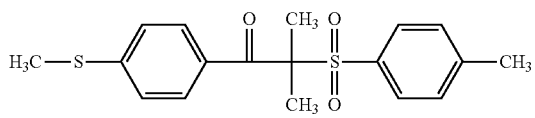

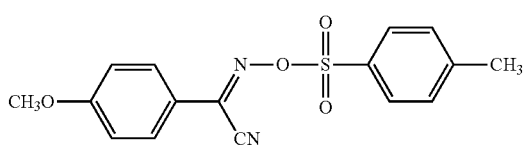

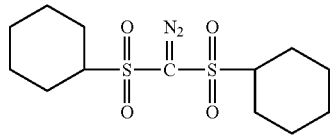

(B) a crosslinking agent used in formulation examples in the present invention, shown in Table 1, is as follows.

Alkylated melamine resin H-1 (available from Sanwa Chemical Co., Ltd.)

(D) epoxy group-containing crosslinking agents used in formulation examples in the present invention, shown in Table 1, are as follows.

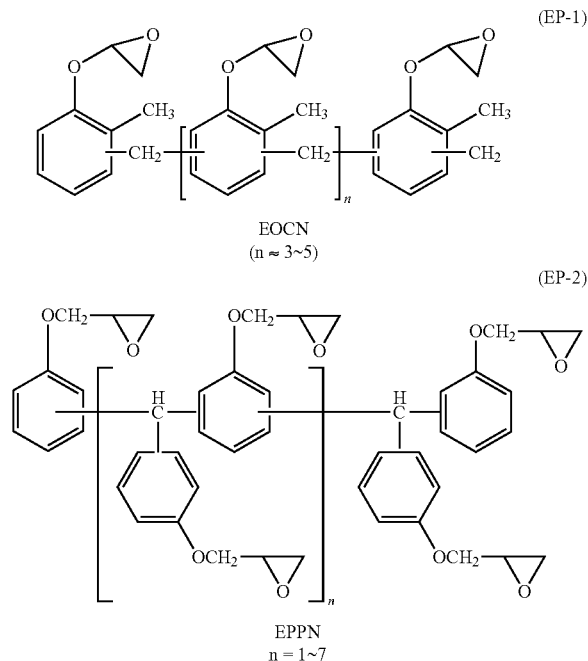

Then, the silicone skeleton-containing polymer compound (component (A)), crosslinking agent (component (B)), photo acid generator (component (C)), epoxy group-containing crosslinking agent (component (D)), and solvent (component (E)) were blended according to the formulation amount shown in Table 1, and the mixture was stirred, mixed, and dissolved at room temperature. The resulting solution was filtered through a 1.0-μm filter made of Teflon (registered trade mark) for microfiltration to obtain chemically amplified negative resist compositions of formulation examples 1 to 3 as the photosensitive material.

TABLE 1

| Component of chemically amplified negative resist composition (part means part by mass) | | | | |
|---|---|---|---|---|
| (A) Silicone skeleton-containing polymer compound | (C) Photo acid generator | (B) Crosslinking agent | (D) Epoxy group-containing crosslinking agent | (E) Solvent |
| Formulation example 1 | | | | |
| A-1 | PAG-1 | H-1 | EP-1 | cyclopentanone |
| 100 parts | 3 parts | 10 parts | 10 parts | 60 parts |
| Formulation example 2 | | | | |
| A-2 | PAG-2 | H-1 | EP-1 | cyclopentanone |
| 100 parts | 1 part | 5 parts | 15 parts | 65 parts |
| Formulation example 3 | | | | |
| A-2 | PAG-3 | H-1 | EP-2 | cyclopentanone |
| 100 parts | 2 parts | 10 parts | 10 parts | 65 parts |

[Production of Photo-Curable Dry Film]

By using a die coater as a film coater and a polyethylene terephthalate film (thickness: 38 μm) as a supporting film, the photosensitive material of formulation example 1 was applied onto the supporting film. The film was caused to pass through a hot-air circulating oven (length: 4 m) at 100° C. over 5 minutes to form a photosensitive insulating layer on the supporting film. The thickness of the photosensitive insulating layer was 100 μm. A polyethylene film (thickness: 50 μm) was then laminated as a protective film on the photosensitive insulating layer with a laminate roll under a pressure of 1 MPa to produce a photo-curable dry film. In addition, the photosensitive materials of formulation examples 2 and 3 were also used to produce photo-curable dry films, in the same manner as the photosensitive material of formulation example 1.

Example 1

A first substrate (a first circuit board) having an electrode pad with a diameter of 20 μm and a height of 4 μm, which serves as a conductive connection portion, and a second substrate having a conductive plug with a diameter of 15 μm and a height of 5 μm protruding from the substrate were used. The tip of the conductive plug of the second substrate was plated with SnAg 1 μm thick. The conductive plug of the second substrate was designed to align with the electrode pad of the first substrate when the second substrate is placed at a predetermined position above the first substrate.

Onto the first substrate having a diameter of 200 mm (8 inch) was applied the photosensitive material solution of formulation example 1 by a spin coater so as to give a film thickness of 9.5 μm. To remove the solvent, prebaking was performed with a hot plate at 130° C. for 2 minutes, and exposure was performed via a quartz mask designed to shield the electrode pad. As an exposure apparatus, a contact aligner manufactured by SUSS MicroTec AG was used. After exposure, PEB was performed with a hot plate at 130° C. for 3 minutes, and the substrate was cooled. Then, the first substrate after application was developed by spraying 2-propanol for 5 minutes to form, on the first substrate, a photo-curable resin film (photosensitive insulating layer) having an opening on the electrode pad.

The first substrate after development was aligned with the second substrate having the conductive plug such that the electrode pad was connected to the conductive plug, and the first substrate and the second substrate were bonded via the photo-curable resin film by applying a load of 10 kN for 5 minutes under heating at 160° C. For bonding the substrates, a wafer bonder manufactured by EV group was used.

Subsequently, SnAg on the tip of the plug was melted by heating at 260° C. for 30 seconds to electrically connect the conductive plug and the electrode pad. Further, the film was finally cured by heating at 180° C. for 2 hours in an oven under an inert gas atmosphere. The first substrate and the second substrate after curing were favorably bonded and electrically connected well.

Example 2

A first substrate having an electrode pad with a diameter of 100 μm and a height of 4 μm, which serves as a conductive connection portion, and a second substrate having a conductive plug with a diameter of 60 µm and a height of 40 µm protruding from the substrate were used. The tip of the conductive plug of the second substrate was plated with SnAg 3 µm thick. The conductive plug of the second substrate was designed to align with the electrode pad of the first substrate when the second substrate is placed at a predetermined position above the first substrate.

The protective film of the photo-curable dry film having a resin thickness of 45 µm produced with the photosensitive material of formulation example 2 was removed. The photosensitive insulating layer on the supporting film was then bonded to the second substrate having a diameter of 200 mm by a vacuum laminator TEAM-100RF (manufactured by Takatori Corp.) with a vacuum degree in the vacuum chamber of 80 Pa. The temperature condition was 110° C. After the pressure was resumed to normal pressure, the substrate was taken out from the vacuum laminator, and the supporting film was removed. Then, prebaking was performed with a hot plate at 130° C. for 5 minutes to enhance substrate adhesion. The obtained photosensitive insulating layer was exposed to light with the same exposure apparatus of contact aligner type as above. After exposure, PEB was performed with a hot plate at 130° C. for 5 minutes, and the substrate was cooled. Then, the substrate was developed by puddling PGMEA for 50 seconds 6 times and then spraying IPA for 1 minute to form, on the second substrate, a photo-curable resin film (photosensitive insulating layer) having an opening on the conductive plug.

The first substrate was aligned with the second substrate after development such that the electrode pad was connected to the conductive plug, and the first substrate and the second substrate were bonded via the photo-curable resin film by applying a load of 10 kN for 5 minutes under heating at 160° C. For bonding the substrates, a wafer bonder manufactured by EV group was used. Subsequently, SnAg on the tip of the plug was melted by heating at 260° C. for 30 seconds to electrically connect the conductive plug and the electrode pad. Further, the film was finally cured by heating at 180° C. for 2 hours in an oven under an inert gas atmosphere. The first substrate and the second substrate after curing were favorably bonded and electrically connected well.

Example 3

A first substrate having an electrode pad with a diameter of 15 µm and a height of 4 µm, which serves as a conductive connection portion, and a second device having a conductive plug with a diameter of 10 µm and a height of 3 µm protruding from the device were used. The second device was obtained by cutting a substrate having devices into individual pieces. The tip of the conductive plug of the second device was plated with SnAg 1 µm thick. The conductive plug of the second device was designed to align with the electrode pad of the first substrate when the second device is placed at a predetermined position above the first substrate.

Onto the first substrate having a diameter of 200 mm was applied the photosensitive material solution of formulation example 3 by a spin coater so as to give a film thickness of 7.5 µm. To remove the solvent, prebaking was performed with a hot plate at 130° C. for 2 minutes, and exposure was performed via a quartz mask designed to shield the electrode pad. As an exposure apparatus, a contact aligner manufactured by SUSS MicroTec AG was used. After exposure, PEB was performed with a hot plate at 130° C. for 3 minutes, and the substrate was cooled. Then, the first substrate after application was developed by spraying 2-propanol for 5 minutes to form, on the first substrate, a photo-curable resin film (photosensitive insulating layer) having an opening on the electrode pad.

The surface on which the conductive plug of the second device has been formed was aligned with the connection terminal (the electrode pad) on the first substrate, and the pressure-bonding step and the electrically connecting step were simultaneously performed. More specifically, while SnAg on the tip of the plug was melted at 260° C. in 5 seconds, the first substrate and the second device were pressure-bonded such that the electrode pad and the conductive plug were connected. The pressure-bonding was then continued for 15 seconds while the second device was heated at 160° C. to bond the second device and the first substrate via the photo-curable resin film. Further, the film was finally cured by heating at 180° C. for 2 hours in an oven under an inert gas atmosphere. The first substrate and the second device after curing were favorably bonded and electrically connected well.

Example 4

Onto a 200-mm diameter first substrate having an electrode pad with a diameter of 20 µm and a height of 4 µm, which serves as a conductive connection portion, was applied the photosensitive material solution of formulation example 2 by a spin coater so as to give a film thickness of 6 µm. To remove the solvent, prebaking was performed with a hot plate at 130° C. for 2 minutes, and exposure was performed via a quartz mask designed to shield the electrode pad. As an exposure apparatus, a contact aligner manufactured by SUSS MicroTec AG was used. After exposure, PEB was performed with a hot plate at 130° C. for 3 minutes, and the substrate was cooled. Then, the first substrate after application was developed by spraying 2-propanol for 5 minutes to form, on the first substrate, a photo-curable resin film (photosensitive insulating layer) having an opening on the electrode pad.

As the second substrate, a 200-mm diameter substrate having a plug with a diameter of 15 µm and a height of 6.5 µm was used. The tip of the conductive plug of the second substrate was plated with SnAg 1 µm thick. Onto the second substrate having the plug was applied the photosensitive material solution of formulation example 2 by a spin coater so as to give a film thickness of 10 To remove the solvent, prebaking was performed with a hot plate at 130° C. for 2 minutes, and exposure was performed via a quartz mask designed to shield the conductive plug. As an exposure apparatus, a contact aligner manufactured by SUSS MicroTec AG was used. After exposure, PEB was performed with a hot plate at 130° C. for 3 minutes, and the substrate was cooled. Then, the second substrate after application was developed by spraying 2-propanol for 5 minutes to form, on the second substrate, a photo-curable resin film (photosensitive insulating layer) having an opening on the conductive plug.

The first substrate was aligned with the second substrate such that the electrode pad was connected to the conductive plug, and the first substrate and the second substrate were bonded via the photo-curable resin films by applying a load of 10 kN for 5 minutes under heating at 160° C. For bonding the substrates, a wafer bonder manufactured by EV group was used. Subsequently, SnAg on the tip of the plug was melted by heating at 260° C. for 30 seconds to electrically connect the conductive plug and the electrode pad. Further, the film was finally cured by heating at 180° C. for 2 hours in an oven under an inert gas atmosphere. The first substrate and the second substrate after curing were favorably bonded and electrically connected well.

It should be noted that the present invention is not limited to the above-described embodiments. The above-described embodiments are described for illustrative purposes, and those having substantially the same configuration and those providing the same operational advantage as the technical concept described in the claims of the present invention are all encompassed in the technical scope of the present invention.

The invention claimed is:

1. A method for manufacturing a semiconductor apparatus having a three-dimensional layered structure formed by stacking a plurality of semiconductor circuit layers, the method comprising:
preparing a first substrate and a second substrate or a second device to be stacked on the first substrate, the first substrate being provided with an electrode pad exposed to an outside of the substrate for serving as a conductive connection portion, or being provided with the electrode pad and a conductive plug composed of a conductive material and protruding from the electrode pad, the second substrate, if present, and the second device, if present, being provided with a conductive plug composed of a conductive material and exposed to an outside of the device or the substrate;
forming a solder ball on at least one of the electrode pad or the conductive plug of the first substrate and the conductive plug of the second substrate or the second device;
covering at least one of a surface on which the electrode pad of the first substrate has been formed and a surface on which the conductive plug of the second substrate or the second device has been formed with a photosensitive insulating layer formed from a chemically amplified negative resist composition containing:
(A) a silicone skeleton-containing polymer compound having a repeating unit shown by the following general formula (1) and having a weight average molecular weight of 3,000 to 500,000,

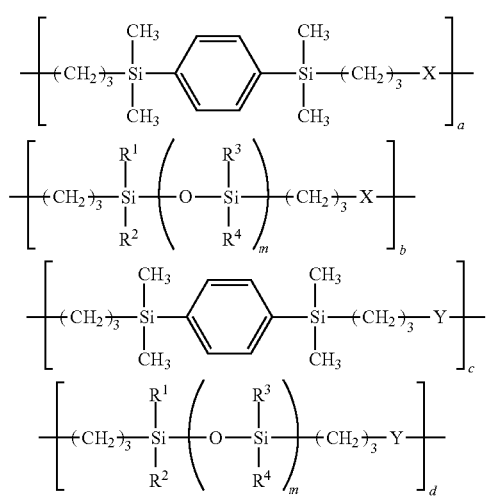

where $R^1$ to $R^4$ may be the same or different and represent a monovalent hydrocarbon group having 1 to 8 carbon atoms; "m" is an integer of 1 to 100; "a", "b", "c", and "d" are each 0 or a positive number, and "a", "b", "c", and "d" are not simultaneously 0, provided that a+b+c+d=1; X represents an organic group shown by the following general formula (2); and
Y represents an organic group shown by the following general formula (3);

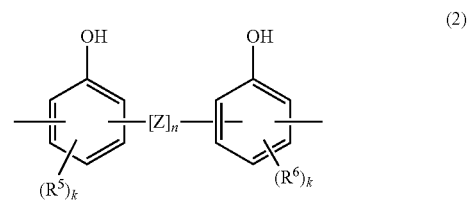

where Z represents a divalent organic group selected from

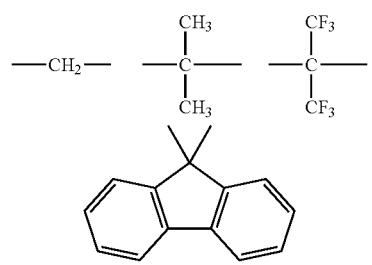

"n" is 0 or 1; $R^5$ and $R^6$ each represents an alkyl group or an alkoxy group having 1 to 4 carbon atoms and may be the same or different from each other; and "k" is 0, 1, or 2;

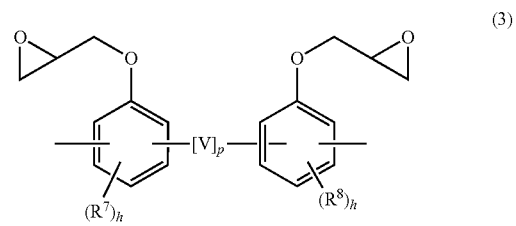

where V represents a divalent organic group selected from

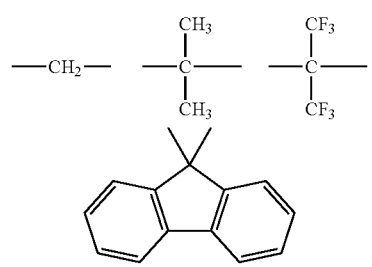

"p" is 0 or 1; $R^7$ and $R^8$ each represents an alkyl group or an alkoxy group having 1 to 4 carbon atoms and may be the same or different from each other; and "h" is 0, 1, or 2,
(B) one or more crosslinking agents selected from: (i) an amino condensate modified with formaldehyde or formaldehyde-alcohol, or (ii) a phenol compound having on average two or more methylol groups or alkoxymethylol groups per molecule, (C) a photo acid generator capable of generating an acid by decomposition with light having a wavelength of 190 to 500 nm,
(D) an epoxy-group containing crosslinking agent, and
(E) a solvent;
forming an opening on the electrode pad or the conductive plug of the substrate or the device that has been covered with the photosensitive insulating layer, by lithography via a mask;
pressure-bonding the conductive plug of the second substrate or the second device to the electrode pad or the conductive plug of the first substrate with the solder ball through the formed opening;
melting the solder ball by baking to fix and electrically connect the electrode pad or the conductive plug of the first substrate to the conductive plug of the second substrate or the second device, where the pressure-bonding and the electrically connecting are simultaneously performed; and
curing the photosensitive insulating layer by baking.

2. The method for manufacturing a semiconductor apparatus according to claim 1, wherein the preparing step includes cutting a substrate having devices into individual pieces or detaching a device from a substrate to which the device has been temporarily bonded to prepare the second device.

3. The method for manufacturing a semiconductor apparatus according to claim 1, wherein the step of covering with the photosensitive insulating layer includes applying a photosensitive material on at least one of the surface on which the electrode pad of the first substrate has been formed and the surface on which the conductive plug of the second substrate or the second device has been formed, and drying the photosensitive material to form the photosensitive insulating layer.

4. The method for manufacturing a semiconductor apparatus according to claim 3, wherein the preparing step includes cutting a substrate having devices into individual pieces or detaching a device from a substrate to which the device has been temporarily bonded to prepare the second device.

5. The method for manufacturing a semiconductor apparatus according to claim 1, wherein the step of covering with the photosensitive insulating layer includes laminating a photo-curable dry film on at least one of the surface on which the electrode pad of the first substrate has been formed and the surface on which the conductive plug of the second substrate or the second device has been formed to form the photosensitive insulating layer, the photo-curable dry film being obtained by applying a photosensitive material on a supporting film and drying the photosensitive material.

6. A method for manufacturing a flip-chip type semiconductor apparatus, comprising stacking a plurality of semiconductor apparatuses manufactured by the method according to claim 1, whereby a flip-chip type semiconductor apparatus is manufactured.

7. The method for manufacturing a semiconductor apparatus according to claim 1, wherein a distance between the first substrate and the second substrate or the second device ranges from 10 μm to 500 μm.

8. The method for manufacturing a semiconductor apparatus according to claim 1, wherein component (D) includes an epoxy compound having two or more epoxy groups per molecule.

9. The method for manufacturing a semiconductor apparatus according to claim 8, wherein component (D) is at least one selected from the group consisting of a bisphenol epoxy resin, a novolac epoxy resin, a triphenol alkane epoxy resin and a polymer thereof, a biphenyl epoxy resin, a dicyclopentadiene-modified phenol novolac epoxy resin, a phenol aralkyl epoxy resin, a biphenyl aralkyl epoxy resin, a naphthalene ring-containing epoxy resin, a glycidyl ester epoxy resin, a alicyclic epoxy resin, and a heterocyclic epoxy resin.

10. The method for manufacturing a semiconductor apparatus according to claim 9, wherein component (D) is at least one bisphenol epoxy resin selected from the group consisting of bisphenol A epoxy resin and bisphenol F epoxy resin.

11. The method for manufacturing a semiconductor apparatus according to claim 9, wherein component (D) is at least one novolac epoxy resin selected from the group consisting of a phenol novolac epoxy resin and a cresol novolac epoxy resin.

* * * * *